United States Patent [19]

Andersen et al.

[11] Patent Number: 4,550,425
[45] Date of Patent: Oct. 29, 1985

[54] SPEECH SAMPLING AND COMPANDING DEVICE

[75] Inventors: David P. Andersen, Burnsville; Raymond C. Hedin, Apple Valley; John F. Siebenand, Eagan, all of Minn.

[73] Assignee: Sperry Corporation, New York, N.Y.

[21] Appl. No.: 420,545

[22] Filed: Sep. 20, 1982

[51] Int. Cl.[4] .................. G10L 1/00; H03K 13/22
[52] U.S. Cl. ...................... 381/30; 340/347 DD; 381/34; 381/106
[58] Field of Search .................. 381/29–35, 381/106; 340/347 DD; 358/261

[56] References Cited

U.S. PATENT DOCUMENTS 3,502,806  3/1970  Townsend .................. 358/261
3,945,002  3/1976  Duttweiler et al. ......... 340/347 DD
4,464,783  8/1984  Beraud et al. .............. 381/31

Primary Examiner—E. S. Matt Kemeny
Attorney, Agent, or Firm—William C. Fuess; Glenn W. Bowen

[57] ABSTRACT

An analog speech signal is sampled of a nominal rate of 6 kilohertz and digitized in a Mu-Law Encoder. The digital output of the Mu-Law Encoder is converted by a microprocessor performing table look-up to linearized pulse code modulation (PCM) samples nominally of eight bits per sample. Using a BSPCM (Block Scaled Pulse Code Modulation) method, in each block of nominally 246 eight-bit PCM samples (representing approximately 41 milliseconds), the maximum and minimum sample values are found and used to calculate a scale factor equal to the maximum sample value minus the minimum sample value, with the difference being then divided by a constant number nominally equaling 16. Then the BSPCM samples are generated from the PCM samples each as a corresponding one PCM sample minus the minimum PCM sample value, the difference being then divided by the scale factor. In effect, the bit rate is reduced by adjusting the step size to follow the local block dynamic range. The BSPCM samples so created are susceptible to signal processing operations like as to PCM samples. When the BSPCM encoded words plus the minimum, PCM encoded, sample plus the range increment scale factor are stored as a data block, then such data block can, at a later time, be decoded, or reconstituted, into linear PCM data. A silence interval is encoded as zero amplitude using run length coding of the number of blocks. Such digital PCM data can be converted to an analog audio signal for voice output across a telephone system.

13 Claims, 37 Drawing Figures

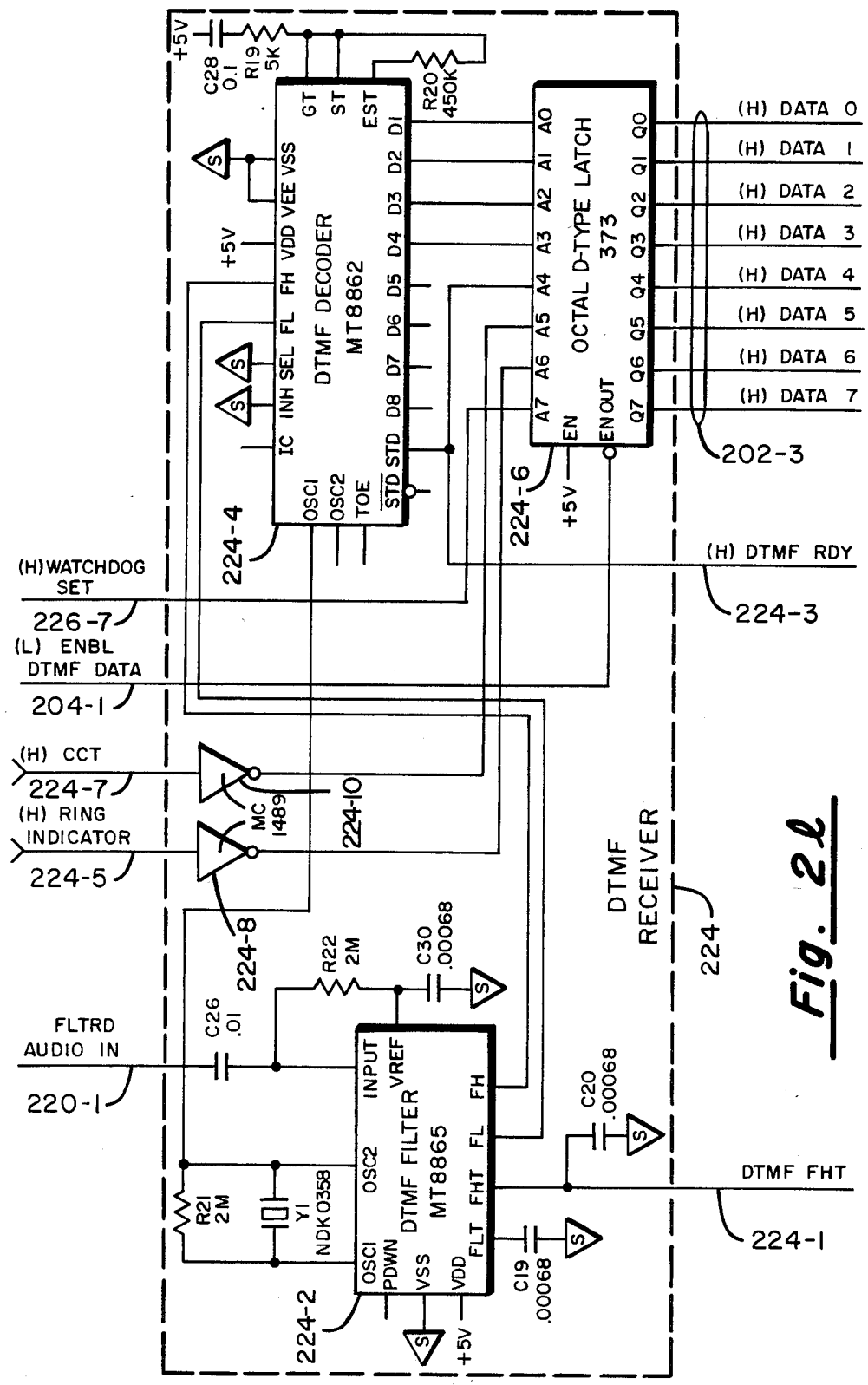

RANGE INCREMENT = (MAX-MIN)/16
4-BIT CODE WORD = (A/D SAMPLE-MIN)/RANGE INCREMENT

|   | 7 | 6 | 5 | 4 | 3 | 2 | 1 | 0 |
|---|---|---|---|---|---|---|---|---|
| BYTE 0 | AUDIO CHANNEL | | | | RANGE INCREMENT -1 | | | |
| BYTE 2 | MINIMUM (LINEAR PCM, -128 TO 127) | | | | | | | |
| BYTE 3 | PAUSE DURATION (IN BLOCKS, 0 TO 255) | | | | | | | |
| BYTE 4 | 2ND CODE WORD | | | | 1ST CODE WORD | | | |
| BYTE 5 | 4TH CODE WORD | | | | 3RD CODE WORD | | | |
| ⋮ | ⋮ | | | | ⋮ | | | |
| BYTE 125 | 246TH CODE WORD | | | | 245TH CODE WORD | | | |
| BYTE 126 | XOR CHECKSUM, LEAST SIGNFICANT | | | | | | | |
| BYTE 127 | XOR CHECKSUM, MOST SIGNIFICANT | | | | | | | |

"AUDIO CHANNEL" IS THE I/O CHANNEL NUMBER OF THE CHANNEL WHICH DIGITIZED THESE DATA.
"PAUSE DURATION" OF 0 IMPLIES NO PAUSE.
"XOR CHECKSUM" IS THE 16-BIT SUM, WITHOUT CARRY, OF BYTES 0 THROUGH 125.

*Fig. 7*

MODE

|  | 0<br>IDLE | 1<br>INPUTTING | 2<br>OUTPUTTING | 3<br>SENDING DTMF |
|---|---|---|---|---|
| DTMF INTER. | TRANSFER DTMF, MODE = 0 | TRANSFER DTMF, SUSPEND INPUT COMMAND = STOP START MONITOR MODE = 5 | TRANSFER DTMF, SUSPEND OUTPUT COMMAND = STOP START MONITOR MODE = 6 | TRANSFER DTMF, MODE = 3 |
| STOP | START MONITOR, MODE = 7 | SUSPEND INPUT, MODE = 0 | SUSPEND OUTPUT, MODE = 0 | MODE = 0 |
| INPUT | START INPUT, MODE = 1 | CONTINUE INPUT | SUSPEND OUTPUT MODE = 1 | INITIATE INPUT MODE = 2 |
| OUTPUT | START OUTPUT, MODE = 2 | INITIATE OUTPUT MODE = 2 | CONTINUE OUTPUT | INITIATE OUTPUT MODE = 2 |
| SEND DTMF | MODE = 3 | TERMINATE INPUT MODE = 3 | TERMINATE OUTPUT MODE = 3 | OUTPUT 1 DTMF CHARACTERS UNTIL WC = 0 THEN MODE = 0 |
| TEST | INITIATE TEST MODE = 4 | MODE = 0 | MODE = 0 | MODE = 0 |

*Fig. 9a*

| | MODE | | | |
|---|---|---|---|---|
| | 4 TESTING | 5 INPUT SUSP'D | 6 OUTPUT SUSP'D | 7 MONITOR |
| DTMF INTER. | DISCARD CHAR., MODE = 4 | TRANSFER DTMF MODE = 5 | TRANSFER DTMF MODE = 6 | TRANSFER DTMF, RESTART MONITOR MODE = 7 |
| STOP | TERMINATE TEST MODE = 0 | CONTINUE MONITOR MODE = 5 | CONTINUE MONITOR MODE = 6 | MODE = 7 |
| INPUT | IGNORE, MODE = 4 | RESUME INPUT MODE = 1 | INITIATE INPUT MODE = 1 | MODE = 0 |
| OUTPUT | IGNORE, MODE = 4 | START OUTPUT MODE = 2 | RESUME OUTPUT MODE = 2 | MODE = 0 DISABLE SPEECH PRESENT INTERRUPT |
| SEND DTMF | IGNORE, MODE = 4 | MODE = 2 | MODE = 3 | MODE = 3 |
| TEST | CONTINUE TILL DONE THEN SET CMB & RESTART TEST MODE = 4 | MODE = 0 | MODE = 0 | DISABLE SPEECH INTERRUPT MODE = 0 |

*Fig. 9b*

PAUSE = 1   IF PAUSE DECODING IS IN PROGRESS.

PAUSCNT =   NUMBER OF CONSECUTIVE PAUSE BLOCKS
            TO OUTPUT. ALL BUT LAST BLOCK ARE
            PRE-STORED NOISE.

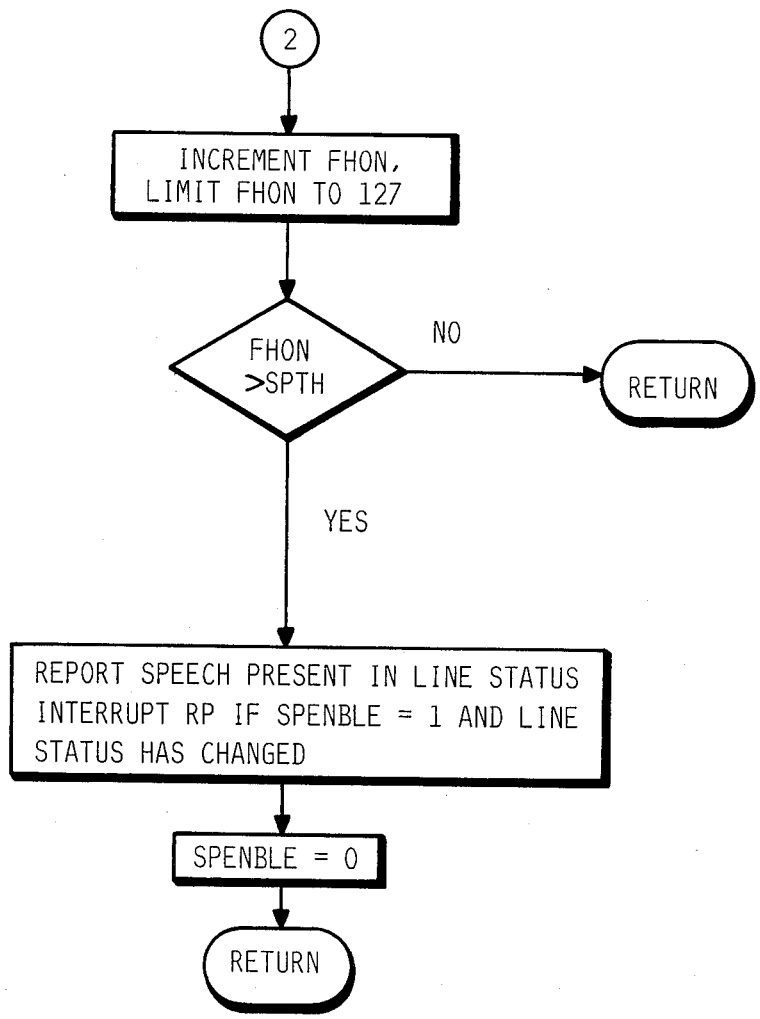

```
LASTTIME = 0    IF LAST BLOCK WAS BELOW THRESH.
LASTTIME = 1    IF LAST BLOCK WAS ABOVE THRESH.
THRESH =        ENERGY-PRESENT THRESHOLD.
DAON =          NUMBER OF CONSECUTIVE BLOCKS ABOVE THRESH.
DAOFF =         NUMBER OF CONSECUTIVE BLOCKS BELOW THRESH.
FHON =          NUMBER OF CONSECUTIVE FILTERED BLOCKS ABOVE
                THRESH.
SPENBLE = 1     ENABLES SPEECH-PRESENT INTERRUPT.
RING =          RING SIGNAL PRESENT FROM TELEPHONE INTERFACE.
```

*Fig. 12b*

MAX = MOST NEGATIVE MU-LAW SAMPLE INPUT DURING LAST OUTPUT.

K1, K2 = ENERGY RANGE OF DIAL-TONE.

DURAT = NUMBER OF CONSECUTIVE INTERVALS HAVING ENERGY WITHIN THE DIAL-TONE RANGE.

SPEECH SAMPLING AND COMPANDING DEVICE

BACKGROUND OF THE INVENTION

1. Field of the Invention

The present invention relates to the digital recording and playback of speech over the public telephone network. The electronic circuit and methods of the present invention enable performance of the following functions: analog-to-digital conversion, digital-to-analog conversion, bit compression to 24 kilobits per second, placement and receipt of telephone calls while monitoring the line for dial tone, busy, ringing, speed and silence: detection of Dual Tone Multi-Frequency (DTMF, trademark of the American Telephone and Telegraph Company); pause removal, loudness control, speed rate control, speed-up and slow-down. Applications for the circuit and methods of the present invention are voice store-and-forward, voice response, and other voice message switching via digital means.

2. Description of the Prior Art

The circuit and method of the present invention will enable a particular digital coding of speech which will be called Block-Scaled Pulse Code Modulation (BSPCM). A survey paper on the multitudinous prior art methods of digital speech coding is the article "Speech Coding" by James L. Flannigan et al. appearing in the IEEE Transactions on Computers, Volume COM-27 No. 4, April, 1979 at page 710. Generally the range of a speech signal varies slowly compared to its sampling rate. As a consequence, encoding the step size as well as the individual samples allows a desirable reduction in total bit rate. The signal level increases along with the quantization noise level, masking the noise. There are several prior art adaptive coding schemes for speech which are based on this principle. Primary techniques are adapted differential pulse code modulation (ADPCM) and continuously variable slope deltamode (CVSD). One of the major disadvantages of adaptive coding schemes is that the step size of each sample is computed from the step size and magnitude of preceeding samples. When a bit error occurs, or if the preceding information is missing, the step size information may be lost for the following syllable or word. The decoded speech may thusly be badly distorted until a quiescence in the speech waveform resets the step size to its minimum value. Also data cannot, in general, be edited or spliced and signal processing operations (gain control, mixing, thresholding, etc.) cannot be performed on the data directly.

The prior art technique of pulse code modulation (PCM) encoding is especially desirable for editing, signal processing, and signal detection because each encoded sample is independent of preceding samples, and each encoded sample is directly proportional to the amplitude of the signal. Unfortunately, PCM encoding generally requires about twice the bit rate of adaptive coding schemes for equivalent quality voice reproduction. It will later be seen that the coding scheme of the present invention is also PCM-type because it is not adaptive—each sample is proportional to the signal magnitude and not a function of the preceding history of the signal. But, like the adaptive coding schemes, the coding scheme of the present invention will accomplish a reduction in bit rate by adjusting the step size to follow the local dynamic range of the signal. Like PCM, the block-scale pulse code modulation encoding scheme of the present invention will permit splicing, editing, and signal processing functions to be readily performed on the signal.

It is also an aspect of the present invention that the speech output signal will be processed for control of loudness, speech rate, pause, and the mixing of speech. The particular algorithms utilized to effect processing of the digitalized speech are not new. In particular, the so-called "cut and splice" method of slowing or speeding speech without altering pitch as is used in the present invention is not new. Electromechanical versions of this algorithm have been known at least since N. B. Kuchenmeister, German Pat. No. 386,983 "Improvements Relating to the Reproduction of Sounds from Records", June 26, 1930. The principle of repeating short segments of speech to slow speaking rate, or discarding them to speed speaking rate, has also been used to synchronize sound tracks of movie projectors and to produce fast-talking recordings for the blind. A reference to such methods is contained in "Time Compressed Speech: An Anthology in Bibliography in Three Volumes" by Sam Drucker, published by the Scarecrow Press, Metuchen, N.J., 1974. All such speech output signal-processing algorithms and methods have, to the best knowledge of the inventors not been previously applied to Block-Scaled Pulse Code Modulation (BSPCM) digitally encoded speech.

It is another aspect of the present invention that Dual Tone Multi-Frequency (DTMF) signals received on and detected from the telephone interface will be utilized for telephone line supervision. The algorithms for detecting telephone signals such as dial tone, ringback, busy, speech, or silence are old in the art. Additionally, the machine placement of telephone calls by the conversion of digitally encoded DTMF signal tones to analog audio is now being accomplished by certain voice response units and office information systems interfacing across telephone lines. Normally, however, such placement of telephone calls performed by a machine is not fully duplex upon the two wire telephone transmission system. Rather, the machine initiates an outgoing call via DTMF signals and then, after placement of the outgoing call, monitors the telephone line status for the status of the call. The present invention performs status monitoring of the outgoing call for dial tone, ringback, busy, speech and silence totally simultaneously with the progress of the dial-out. Thusly, the placement of telephone calls by the apparatus of the present invention is totally automated, with telephone line status being continually monitored along the way. Such automation permits, for example, that the apparatus of the present invention can automatedly call back later if a telephone line is found to be initially busy.

SUMMARY OF THE INVENTION

The present invention is a general purpose, versatile, programmable audio collection, processing and transmitting subsystem. It is normally implementatable upon a printed circuit module to record and playback speech over the public telephone network. The circuit and method of the present invention can perform the following functions: analog-to-digital conversion; digital-to-analog conversion; bit compression to 24 kilobits per second; placement and receipt of telephone calls while monitoring the telephone lines for dial tone, busy, ringing, speech and silence; detection of Dual Tone Multi-Frequency (DTMF) characters; pause removal, loudness control, speech rate control, speed-up and slow-down of speech. Applications for the circuit of method of the present invention are voice store-and-forward, voice response, and other voice message switching as is currently, amongst other applications being incorporated in Digital Office Information Systems.

It is a first object of the present invention that an apparatus and method should be shown for the digital encoding of speech which incorporates both the economical bit rate and noise masking of adaptive coding schemes while permitting the performance of splicing, editing and signal processing functions upon the digital coded information as is characteristic of pulse code modulation encoding. Such first object is met by an apparatus and method for performing Block-Scaled Pulse Code Modulation, which apparatus and method first parses speech into contiguous short blocks. Then common scale factor for the PCM samples in each block is computed from the range of the signal within such block. This scale factor is stored within the block. Conversion of each sample back to its absolute amplitude is accomplished by multiplying the sample code word by the scale factor.

As an adjunct to such first object of the present invention, the conversion to a linear representation of the digital outputs of a companding CODer DECoder (CODEC) by a microprocessor performing a table lookup will be shown. Such a linear encoding of a (greek letter) "mu"-law CODEC code word, and a reverse decoding step which is performed upon output, is a particular means by which analog-to-digital and digital-to-analog conversion is performed by the present invention.

It is another subordinate object to such first object of the invention that signal-processing may be performed in the output of a digitally encoded speech signal. In particular five levels of change of loudness may be imposed via five algorithms. Five levels of change in speech rate may be imposed by five additional algorithms. The pause durations within the encoded speech may be altered in value up to 10 seconds in 41-millisecond increments. Finally, the speech being output may be mixed by adding, sample by sample, a second signal. The application of all such algorithms to the Block-Scaled Pulse Code Modulation (BSPCM) digitally encoded speech suitably produces intelligible (within degradation limits for high speed-up) slowed or accelerated speech upon playback.

It is a second object of the present invention that an apparatus and method be shown which listens for control information (in the form of DTMF signals) from the user continuously while it is transmitting audio. In other words, the apparatus of the present invention is capable of fully duplex operation across two wire transmission systems such as telephone lines. Such full duplex communication is enabled by a two to four-wire signal conversion circuit which cancels the two-wire differential signal output at the four-wire single-ended signal input. Because such full duplex communication is implemented, it is the method of the present invention that status monitoring of the dialing of an outgoing call for busy, ringback, dial tone, speech, or DTMF signals shall be performed coincident with the entire dial out sequence, including DTMF signal transmission, and without any wait to assess, in a second period, the results of a transmission transpiring within a first period. Additionally, such full duplex communication enables that the line is constantly monitored for the occurrence of a dial tone during the transmission of audio.

It is a third object of the present invention that a structure should be shown wherein a network of bus communicative components centering around an audio (micro) processor (AP) should perform real-time audio data encoding and compression, audio signal procesing such as volume control and speech rate control, and telephone line supervision. The structure and function of such an audio processing network is divorced from another, parallel structure not the subject of this application which performs, and verifies the integrity of, all data transfers to and from external digital devices such as central processors, and which generally supervises all command and data transfers to and from the audio (micro) processor (AP) of the audio processing network. The method by which such control and data communication is obtained to the audio (micro) processor (AP) of the audio processing network is through a mailbox technique. Such division of functionality between the audio processing (by an AP) and the processing of communication protocols and digital data transfers with additional digital devices (such as central processors) (by another, communications (micro) processor) is perceived to be efficacious for allowing the audio processing network based upon an audio (micro) processor, to be a complete system within itself containing all elements required for controlling the recording and replay of audio data, manipulation of audio such as by volume and speed control, and telephone line supervision.

BRIEF DESCRIPTION OF THE DRAWINGS

FIG. 1b shows a circuit not part of the present invention of a speech sampling and companding device, but a preferred means of interface communication thereto.

FIG. 2l shows the schematic diagram of the DTMF RECEIVER circuit part of the circuit of the device of the present invention.

FIG. 7 shows a table of the format of the Block-Scaled Pulse Code Modulation (BSPCM) data block such as is generated and manipulated by the circuit of the present invention.

FIG. 9a and FIG. 9b, show the state transfer table reflecting that response which will be taken by the audio processor (AP) of the circuit of the present invention in response to all stimuli recognized by such AP. Thusly, such a state transfer table is the complete definition of the microprogram response which will be assumed by the audio processor of the present invention conditional upon the occurrence of any recognizable eventuality during any operational mode, or state.

FIGS. 12a through 12e, show the flowchart of the microprogram subroutine which monitors the occurrence of control conditions upon the audio signal lines.

DESCRIPTION OF THE PREFERRED EMBODIMENT

Figure 1A:
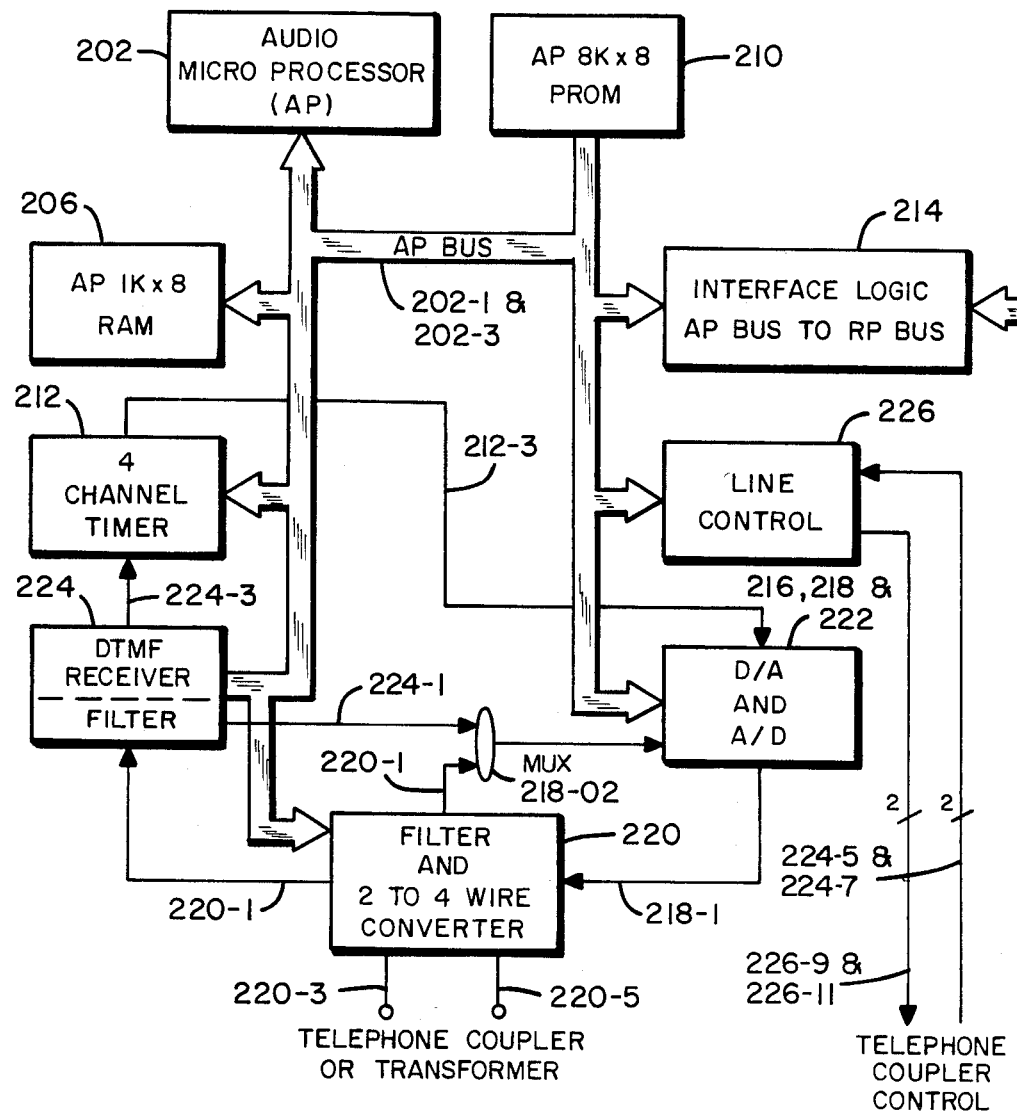
FIG. 1a shows the speech sampling and companding device of the present invention such as provides control of audio functions, processes audio inputs and outputs, has a analog interface to a telephone line, and which exhibits a digital data and control interface to another, communications, processor across an RP bus.

The present invention of a speech sampling and companding device is a general purpose, versatile and programmable audio collection processing and transmitting subsystem. The block diagram of the present invention as a bus interconnected audio processing network is shown in FIG. 1a, which interconnects to the communications processing network of FIG. 1b for the purposes of a digital interface to other system devices, such as central processors. Both the speech sampling and companding device, or audio signal processing network, of FIG. 1a and the digital interface communications controller of FIG. 1b are jointly implementatable from monolithic integrated circuit components upon a single pluggable module, of approximate 6 by 9 inch dimension. Such a module is called a voice input/output module and, when replicated for each voice communication channel allows a single, moderate performance, minicomputer to control and manage voice message processing tasks on a large number of voice channels simultaneously. Such tasks include voice message store-and-forward, voice message editing, and the transcription and playback of voice dictation. Thusly the voice input/output module may be utilized in the new voice information processing systems coming on the market in the early 1980's time frame, and terminal equipment and in voice response units. The voice input/output module is completely programmable in both the speech sampling and companding device and in the communications controller parts, making it versatilely applicable to a wide range of applications.

Figure 1:
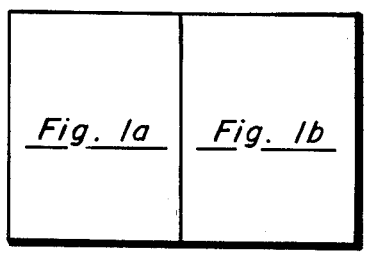
FIG. 1 combines 1a and 1b.
Figure 1B:
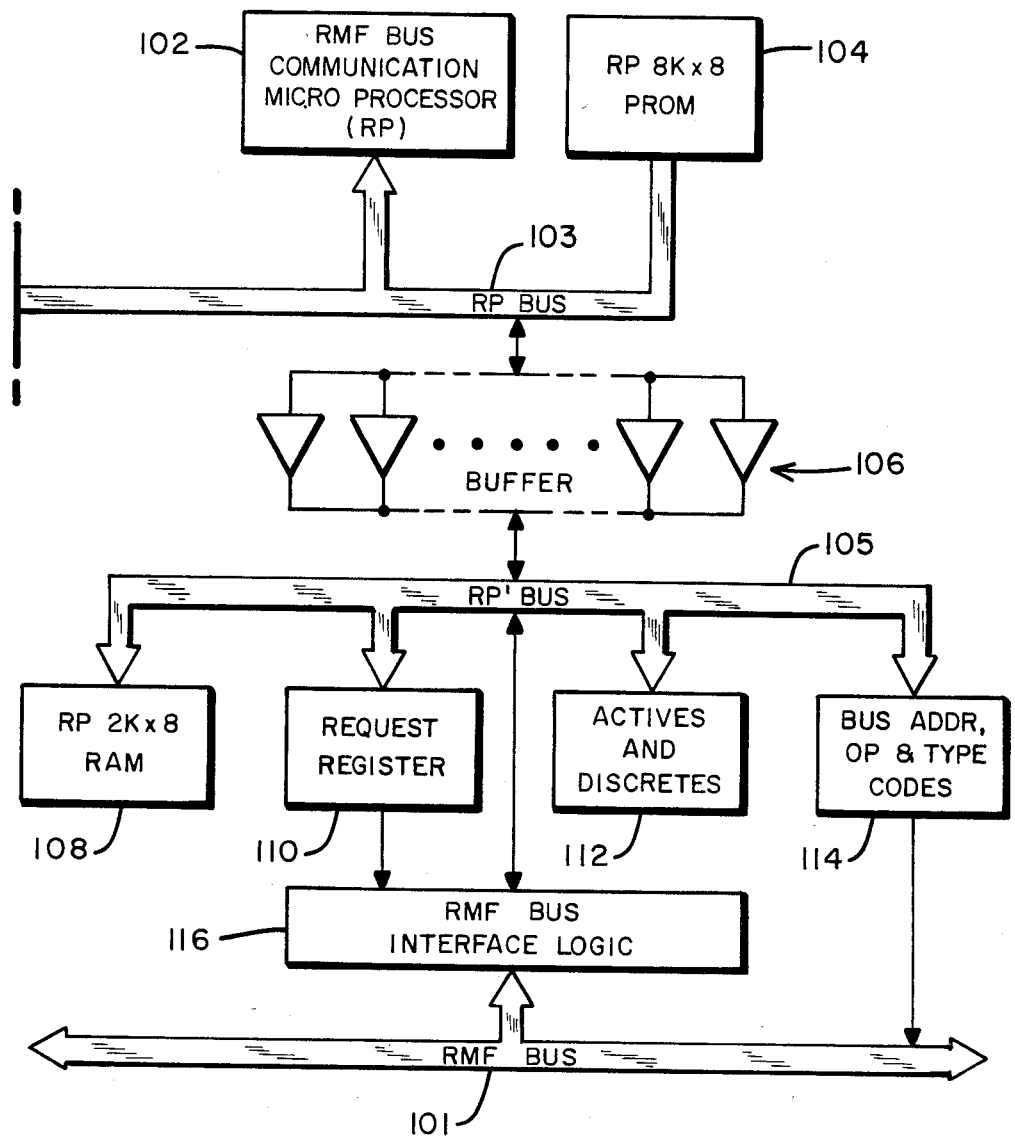
FIG. 1b shows a typical, microprocessor controlled, communications network such as controls and allows digital data transfers to and from external world devices, such as central processors, and generally supervises all command and data transfers to the audio microprocessor (AP) of the audio processing network shown in FIG. 1a. As such.

Continuing in FIG. 1, the voice input/output module contains two independent microprocessors: the AUDIO MICRO PROCESSOR (AP) 202 shown in FIG. 1a which performs the real-time audio data compression and manipulation of the speech sampling and companding device, and the RMF BUS COMMUNICATION MICRO PROCESSOR (RP) 102 shown in FIG. 1b which provides the processing of interface protocol and data transfer for a digital interface to the voiced input/output module. Commencing with the communications controller shown in FIG. 1b, such as is not a part of the present invention of a speech sampling and companding device but which merely provides a general digital interface to such device, such communications controller will supervise all command and data transfers to and from the AUDIO MICRO PROCESSOR (AP) 202 and any external digital device, such as a central processing minicomputer, connected via RMF BUS 101. The RMF BUS 101 is so designated meaning Reconfigurable Modular Family which is a general bus utilized in a number of computer systems of Sperry Univac, the Assignee of the invention. The RMF BUS COMMUNICATION MICRO PROCESSOR (RP) 102 executes microprogram routines contained within the programmable read only memory RP 8K×8 PROM 104. The RMF BUS COMMUNICATION MICRO PROCESSOR (RP) 102 interfaces via RP BUS 103 to the INTERFACE LOGIC AP BUS TO RP BUS 214 and thence via AP BUS 202-1 and 202-3 to AUDIO MICRO PROCESSOR (AP) 202 shown (shown in FIG. 1a). This access path allowing communication between the two microprocessors (AP and RP) is through a "mailbox" technique which allows each to interpret and understand the operating status of the other. Because the overall voice input/output module is a slave to the controlling devices communicating via RMF BUS 101, data transfers over RMF BUS 101 are only set up and supervised by RMF BUS COMMUNICATION MICRO PROCESSOR (RP) 102, and the actual transfer of data is accomplished by hardware logics. Referencing FIG. 1b, such logics first include BUFFER 106 which merely amplifies the signals of RP BUS 103 onto RP' BUS 105 so that the many electrical loads on RP' BUS 105 may be communicatively driven. The RP 2K×8 RAM 108 is a control memory and scratchpad for the RMF COMMUNICATION MICRO PROCESSOR (RP) 102. The ability of RP 2K×8 RAM 108 to buffer digitalized and encoded audio data words being transferred via RMF BUS 101 to other system components reduces the time criticality of synchronization of information transfer upon such interface. The REQUEST REGISTER 110 contains the type of request desired to be made by RMF BUS COMMUNICATION MICRO PROCESSOR (RP) 102 upon the RMF BUS 101. The RMF BUS INTERFACE LOGIC 116 controls the bus protocol, a type of handshaking for the Sperry Univac Reconfigurable Modular Family bus, which transpires on RMF BUS 101. The ACTIVES AND DISCRETES 112 contain a form of status, identifying which operations the RMF BUS 101 allows that the RMF BUS COMMUNICATION MICRO PROCESSOR (RP) 102 can currently do upon such bus. Finally, the BUS ADDR, OP & TYPE CODES 114 is concerned with the transmission of functional command information; not the control protocol of RMF BUS 101, but rather directive, or function, information as opposed to data information. All logics including RMF BUS COMMUNICATION MICRO PROCESSOR (RP) 102 shown in FIG. 1 are solely concerned with the management of control and data such as will allow the speech sampling and companding device of FIG. 1a to be interfaced to a generalized digital communication bus, the RMF BUS 101 of FIG. 1b. Such an implementation of a digital bus communication system, including via microprocessor control means, is common in the art and merely provides a first, digital interface to the speech sampling and companding device of the present invention.

The speech sampling and companding device shown in FIG. 1a based on the AUDIO MICRO PROCESSOR (AP) 202 is a complete processing system in itself, containing all elements required for controlling the recording and replay of audio data, manipulation of audio such as volume and speed control, and telephone line supervision. The numbered identifications appearing in FIG. 1a commencing with the numeral "2" are in correspondence to the identically identified structures within the detailed logic diagrams of FIG. 2, thereby allowing an association between the elements of the block diagram of FIG. 1a and the detailed logical schematics of FIG. 2. The AP 8K×8 PROM 210 contains the microprogram store for AUDIO MICRO PROCESSOR (AP) 202. The AP 1K×8 RAM 206 serves as scratchpad storage and buffer space for AUDIO MICRO PROCESSOR (AP) 202. The 4 CHANNEL TIMER 212 is a programmable timer circuit providing timing functions such as are used in sampling and overall telephone line supervision. The DTMF RECEIVER and FILTER 224 is an off-the-shelf component utilized for the decode of Dual Tone Multi-Frequency (DTMF) control signals occurring upon the telephone lines. A second, analog interface of the speech sampling and companding circuit of FIG. 1a is provided through the FILTER AND 2 TO 4 WIRE CONVERTER 220 via lines 220-3 and 220-5 which connect to a TELEPHONE COUPLER OR TRANSFORMER, and thence to the telephone lines for differential reception and transmission. The analog-to-digital (A/D) conversion for input and the digital-to-analog (D/A) for output are provided by D/A AND A/D 216, 218 and 222 by standard components designed for these purposes. The LINE CONTROL 226 interfaces two input control lines 224-5 and 224-7, and two output control lines 226-9 and 226-11, from the telephone coupler. Finally, the INTERFACE LOGIC AP BUS TO RP BUS 214 contains the "mailbox" logics which allow communication between the AUDIO MICRO PROCESSOR (AP) 202 upon the AP BUS 202-1 and 202-3 to the RMF BUS COMMUNICATION MICRO PROCESSOR (RP) 102 upon the RP BUS 103 (shown in FIG. 1b).

The general manner in which data and control flows within the speech sampling and companding device block diagram in FIG. 1a is as follows. Analog speech signals received from the TELEPHONE COUPLER OR TRANSFORMER as differential two wire signals via lines 220-3 and 220-5 are converted to four wire single-ended signals, and filtered, in FILTER AND 2 TO 4 WIRE CONVERTER 220. The filtered, single-ended four wire analog input signal is transmitted via line 220-1 both to DTMF RECEIVER and FILTER 224 and to multiplexer MUX 218-02. The DTMF RECEIVER and FILTER 224 provides upon line 224-1 the high filtered (approximately 1100 to 1600 Hertz) analog output signal which is used for detection of telephone line status signals such as ringback or busy. The DTMF RECEIVER and FILTER 224 also provides upon the AP BUS 202-1 and 202-3 a digital representation of detected DTMF control signals. When no analog signal is present from the DTMF RECEIVER and FILTER 224 on line 224-1 but an analog signal is present on line 220-1 from the FILTER AND 2 TO 4 WIRE CONVERTER 220, then a telephone line status signal is present. This signal is digitalized in the analog to digital converter section of D/A AND A/D 216, 218, and 222 under the control of sampling timing pulses derived via line 212-3 from 4 CHANNEL TIMER 212.

The entirety of the data transfer, both as initially digitalized and later as encoded via Block-Scaled Pulse Code Modulation, is interrupt driven. When a digitalized input data byte is ready at the D/A AND A/D 216, 218 and 222, then the 4 CHANNEL TIMER 212 will generate an interrupt (path not shown) which causes the AUDIO MICRO PROCESSOR (AP) 202 to recover the data byte via the AP BUS 202-1 and 202-3 and lodge such within a first buffer area of the AP 1K×8 RAM 206. Meanwhile, previously received digitalized data bytes within a first buffer are being encoded, through a Block-Scaled Pulse Code Modulation process, and signal processed by AUDIO MICRO PROCESSOR (AP) 202 and lodged in AP 1K×8 RAM 206 as a second, encoded and signal processed, buffer. Also, in a time-multiplexed fashion, the encoded contents of a completely encoded second buffer is being transferred, as a third buffer, from AP 1K×8 RAM 206 to INTERFACE LOGIC AP BUS TO RP BUS 214 via AP BUS 202-1 and 202-3 under control of AUDIO MICRO PROCESSOR (AP) 202. In a like manner, when data is received from RP BUS 103 (shown in FIG. 1b) through INTERFACE LOGIC AP BUS TO RP BUS 214, it is moved by AUDIO MICRO PROCESSOR (AP) 202 via the AP BUS 202-1 and 202-3 for buffered output storage within AP 1K×8 RAM 206. Such Block-Scaled Pulse Code Modulation digitally encoded output words are signal processed and reconstituted into plain text by the AUDIO MICRO PROCESSOR (AP) 202 and then sent, under timing control arising from 4 CHANNEL TIMER 212, to the digital to analog converter section of D/A AND A/D 216, 218 and 222. The analog output signal developed in D/A AND A/D 216, 218 and 222 is transferred via line 218-1 to FILTER AND 2 TO 4 WIRE CONVERTER 220 and thence via lines 220-3 and 220-5 as a differential analog output signal. Thusly the speech sampling and companding device shown in block diagram form in FIG. 1a permits of the receipt and digitalization of audio signals, the encoding and processing of such digitalized signals as to obtain volume and speech rate control, the conversion of digitalized messages to analog signals for transmission across two wire differential lines, and telephone line supervision.

The schematic logic diagrams of the present invention of a speech sampling and companding device are shown in FIG. 2, consisting of FIG. 2a through FIG. 2m. Logical elements possess identification numbers which are, in the last digit, even. Logical interconnect routing possesses identification numbers which are, in the last digit, odd. The parenthesized logical (H), meaning logical High, or +3 volts, and the parenthesized logical (L), meaning logically Low or 0 volts d.c. or ground, identify the logical level which the named signal will assume when true. All signals which either ingress to, or egress from, the logics of the present invention are particularly identified by arrowtips, or "V". The source origin, or destination, as well as the nature of these externally connecting signals will be clearly explained. The other signals, such as connect internally within the speech sampling and companding device circuit upon all the sheets of FIG. 2, will be identically named and designated wheresoever used. Voltage supplies of +5 V, −5 V, +12 V, and −12 V are obtained from an external power supply. The "A" and "S" designations within small triangles respectively designate analog and signal grounds, both such grounds as are electrically common at a central point normally within an external power supply. Besides being identified with a descriptive title, logical components employed show a part number. Where such part number is purely numerical, it represents the industry standard TTL logical component. Certain, more complex, monolithic integrated circuit components will be identified as to manufacturing source during the course of the explanation. The representation of the value of all discrete resistors is in ohms, the representation of the value of all discrete capacitors is in microfarads.

Figure 2A:
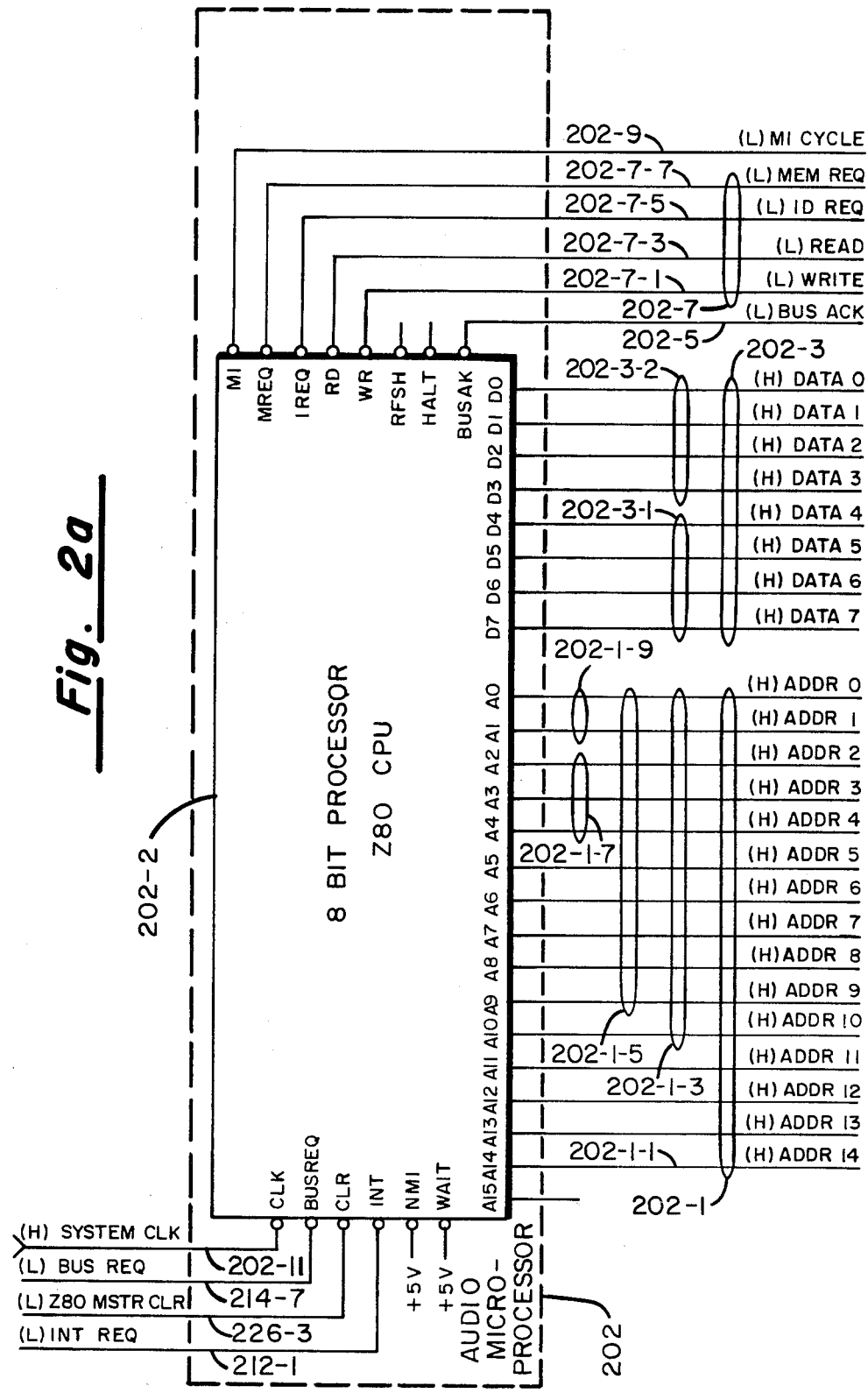
FIG. 2a shows a schematic diagram of the AUDIO MICROPROCESSOR part of the circuit of the device of the present invention.

Commencing with the detailed logical explanation of the circuit of the present invention of a speech sampling and companding device, the AUDIO MICRO PROCESSOR (AP) 202 which is the engine for providing all audio processing and management functions is shown in FIG. 2a. The 8 BIT PROCESSOR Z80 CPU 202-2 is a type Z80 manufactured by Zilog. All interconnecting signals are conventionally utilized as in the manufacturer's description of that device. The only signal connected externally to the logics of the present invention is signal (H) SYSTEM CLK on line 202-11 which is a 4 megahertz clock. It should be noted by momentary reference to FIG. 1a that cable 202-1, which carries signals (H) ADDR 0 through (H) ADDR 14, and cable 202-3 which carries signals (H) DATA 0 through (H) DATA 7, respectively constitute the address and data portions which collectively constitute the AP BUS. The flowcharts of the microprogram executed by the AUDIO MICRO PROCESSOR 202 will later be discussed in conjunction with FIG. 9 through FIG. 13.

Figure 2B:
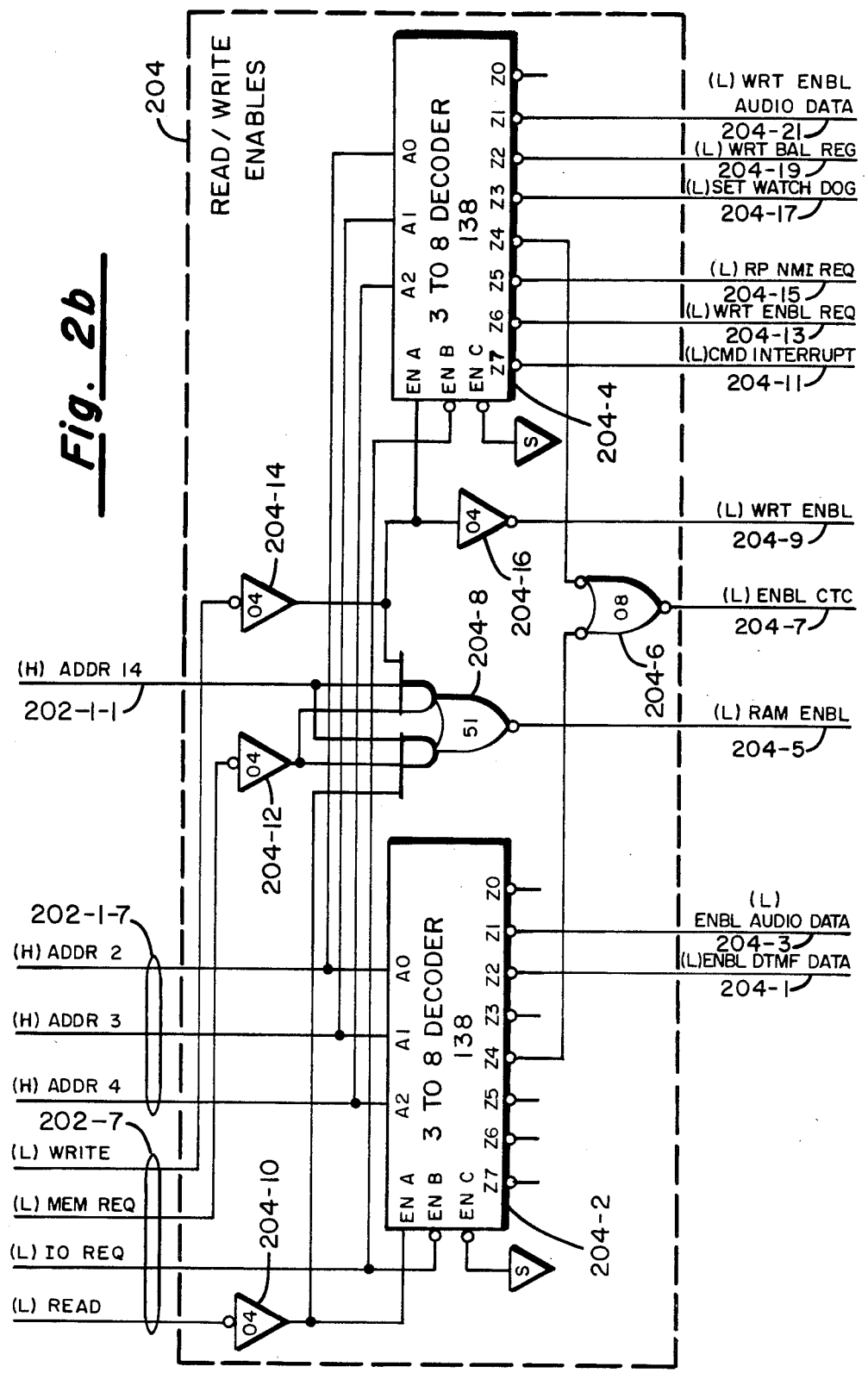
FIG. 2b shows a schematic diagram of the READ/WRITE ENABLES logics part of the circuit of the device of the present invention.

Continuing in FIG. 2b, the READ/WRITE ENABLES 204 logical subsection controls the input/output to/from the AUDIO MICRO PROCESSOR 202 (shown in FIG. 2a). The 3 TO 8 DECODER 138 204-2 is concerned with reading data to the 8 BIT PROCESSOR Z80 CPU 202-2 (shown in FIG. 2a), or the gating of data from other circuit logical elements onto the AP BUS. Conversely, the 3 TO 8 DECODER 138 204-4 is concerned with writing data from the 8 BIT PROCESSOR Z80 CPU 202-2 (shown in FIG. 2a) via the AP BUS to selected logical elements. For example, under the logical Low condition of signal (L) READ part of cable 202-7, plus selected logical High ones of signals (H) ADDR 2 through (H) ADDR 4 on cable 202-1-7, 3 TO 8 DECODER 138 202-2 will decode either signal (L) ENBL AUDIO DATA on line 204-3, signal (L) ENBL DTMF DATA on line 204-1, or a "Z4" signal output which, with a like signal from 3 TO 8 DECODER 138 204-4 is collected in 2 INPUT NAND GATE 204-06 for production of logically Low signal (L) ENBL CTC on line 204-7. The logical Low condition of signal (L) ENBL CTC enables the initialization of the counter timer circuit, the 4 CHANNEL TIMER 212 previously shown in FIG. 1a, and such as will be shown in detailed logical form in FIG. 2f. The 2-WIDE 3-INPUT AND-OR-INVERT gate 204-8 (industry standard part number 51) when satisfied produces logically Low signal (L) RAM ENBL on line 204-5, such as enables reference to the AP 1K×8 RAM 206 previously seen in FIG. 1a. Logical element AND-OR-INVERT 204-8 is satisfied by the logical High condition of signal (H) ADDR 14 on line 202-1-1, and the logical Low condition of signal (L) MEM REQ on line 202-7 as inverted in INVERTER 204-12 logical element, in conjunction with either the logical Low condition of signal (L) READ on cable 202-7 as inverted in INVERTER 204-10 logical element, or the logical Low condition of signal (L) WRITE on cable 202-7 as inverted in INVERTER logical element 204-14. Thusly the RAM is enabled from bit 14 of the address bus in combination with a request to either read or write. The inversion of signal (L) WRITE on cable 202-7 in INVERTER 204-14 is further inverted in INVERTER 204-16 for distribution to the RAM as signal (L) WRT ENBL on line 204-9. Thusly, in summary the READ/WRITE ENABLES 204 shown in FIG. 2b is the logical means by which the AUDIO MICRO PROCESSOR (AP) 202 (shown in FIG. 2a) does encode those discrete control signals required within the circuit of the speech sampling and companding device.

Figure 2C:
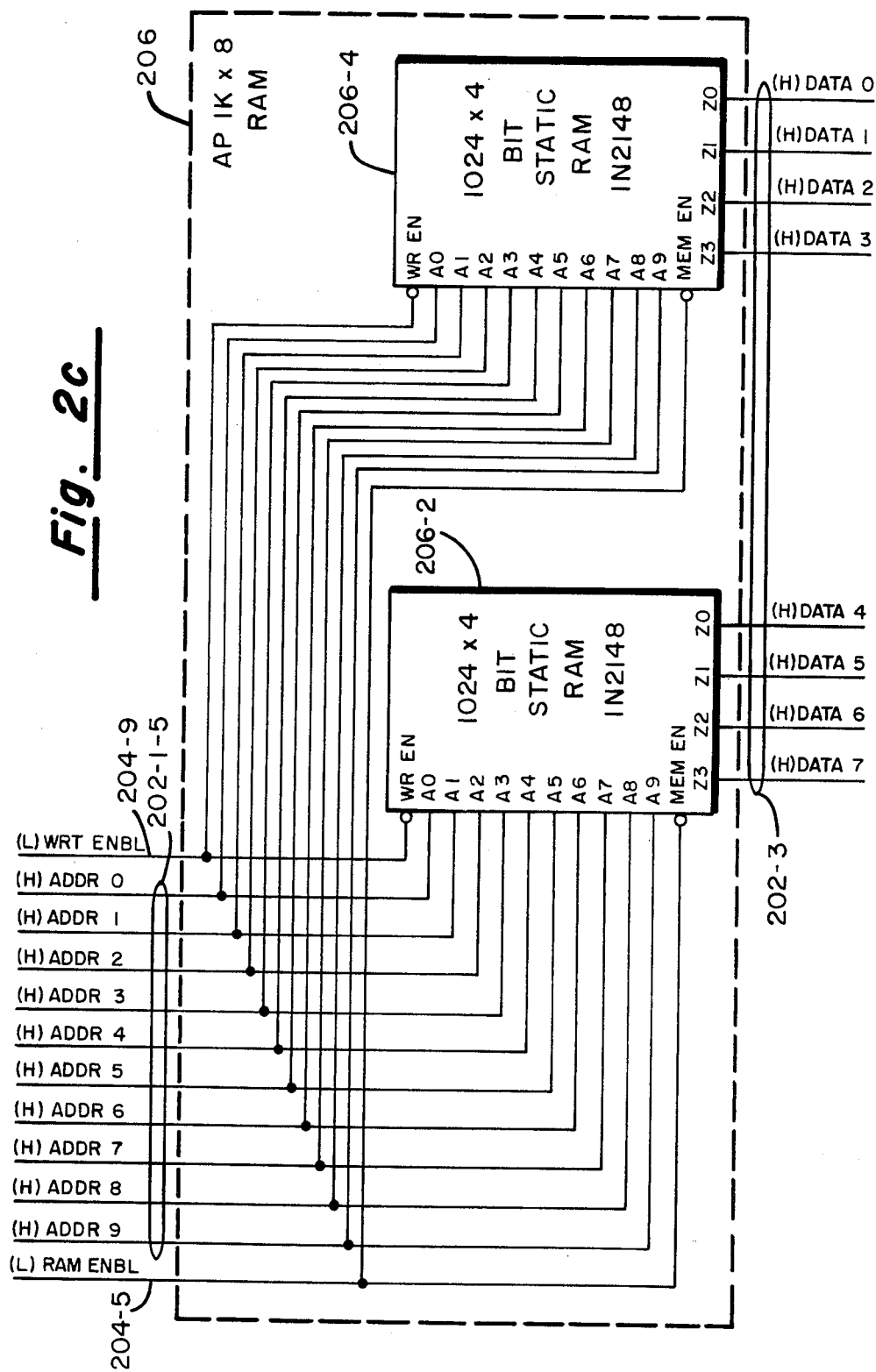
FIG. 2c shows a schematic diagram of the AP 1K×8 RAM part of the circuit of the device of the present invention.

Continuing in FIG. 2c, the AP 1K×8 RAM 206, previously seen in in FIG. 1a, is seen to be composed of 1024×4 BIT STATIC RAM IN2148 206-2 and 206-4. Signals (H) ADDR 0 through (H) ADDR 9 on cable 202-1-5 as address the 1K STATIC RAM are derived from the 8 BIT PROCESSOR Z80 CPU 202-2 (shown in FIG. 2a). Signals (L) RAM EMBL on line 204-5 and signal (L) WRT ENBL on line 204-9, such as in the logical Low condition respectively enable the reading and the writing of the 1K STATIC RAM, are derived from the decode operation just discussed in conjunction with the READ/WRITE ENABLES 204 shown in FIG. 2b. The 1024×4 BIT STATIC RAM IN2148 206-2 and 206-4 supply read, and receive written, data as signals (H) DATA 0 through (H) DATA 7 on bus 202-3.

Figure 2E:
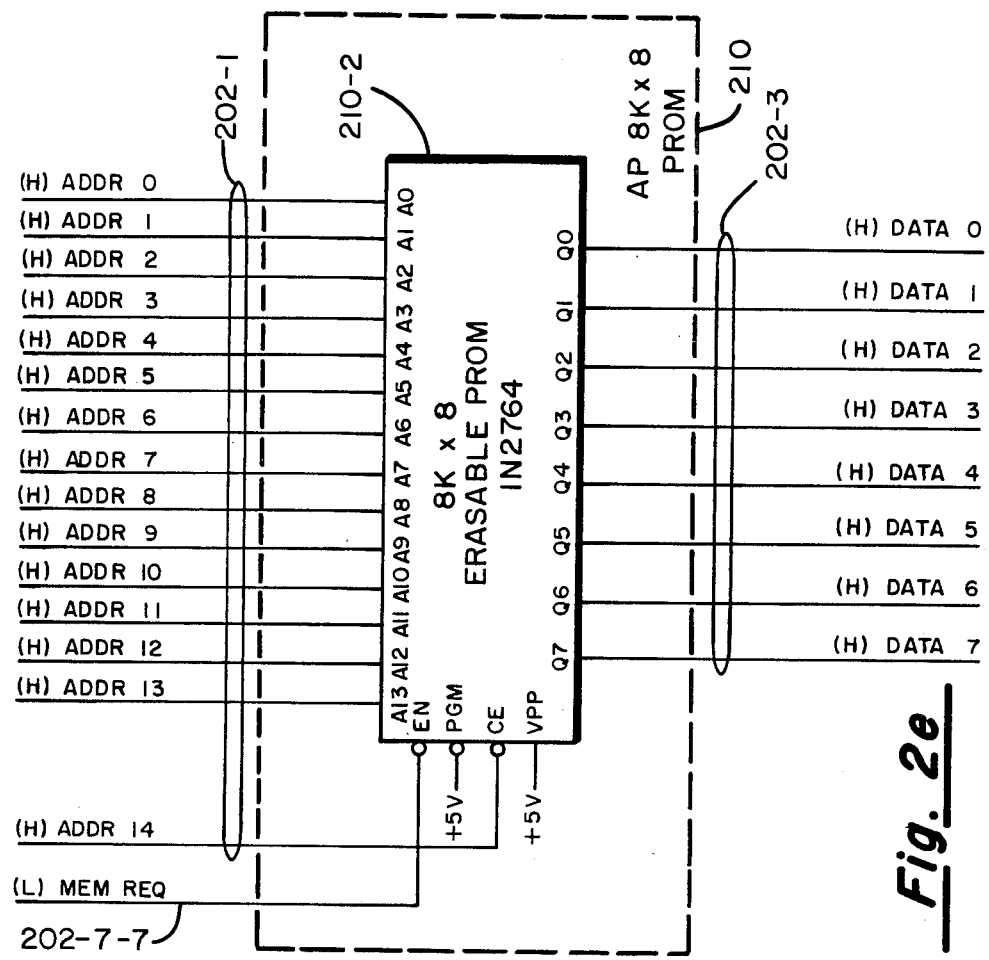
FIG. 2e shows a schematic diagram of the AP 8K×8 PROM part of the circuit of the device of the present invention.
Figure 2D:
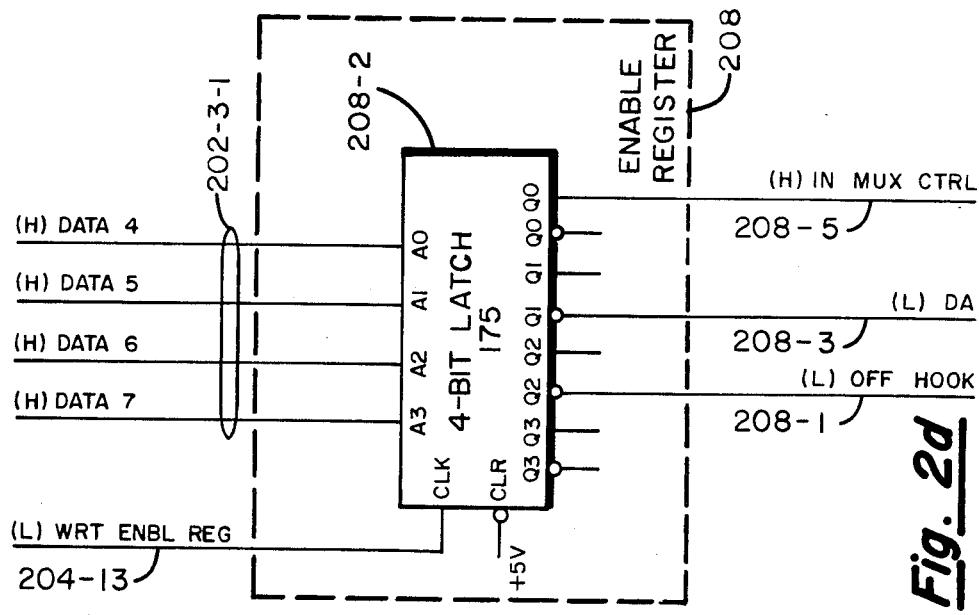
FIG. 2d shows a schematic diagram of the ENABLE REGISTER part of the circuit of the device of the present invention.

Continuing with FIG. 2d, the ENABLE REGISTER 208, implemented as 4-BIT LATCH 175 208-2, is a small control area without exact correspondence within the block diagram of FIG. 1a. The 4-BIT LATCH 175 208-2 is set by the AUDIO MICRO PROCESSOR (AP) 202-2 through logically High signals (H) DATA 4 through (H) DATA 7 on bus 202-3-1 gated by the logical High occurrence of signal (L) WRT ENBL REG on line 204-13. The 4-BIT LATCH 175 208-2 produces signals (L) DA on line 208-3 and (L) OFF HOOK on line 208-1 which, by momentary reference to LINE DRIVER MC 1488 226-10 shown in FIG. 2m, are eventually driven, on lines 226-9 and 226-11 as appear both within FIG. 1a and FIG. 2m, externally to the speech sampling and companding device circuit. These output signals are utilized in the control interface to the telephone coupler. The logical Low condition of signal (L) DA on line 208-3 is utilized to request that a data path through the coupler be cut through to the telephone channel. The logical Low condition of signal (L) OFF HOOK on line 208-1 is utilized to indicate to the telephone coupler that the present telephone channel is to be taken is off hook. The utilization of such signals within a telephone communications environment may be referenced relative to any standard, commercially available, telephone coupler. The remaining signal generated from the setting of the 4-BIT LATCH 175 208-2, signal (H) IN MUX CTRL on line 208-5 is utilized to control the gating of MUX 218-02 (shown in FIG. 1a) in the element of QUAD SPFT JFET SWITCH LF13333 218-02 (shown in FIG. 2i) for the selection between filtered audio (signal FLTRD AUDI IN on line 220-1 as arises at FILTER AND 2 TO 4 WIRE CONVERTER 220 shown in FIG. 1a) and the filtered DTMF signal (signal DTMF FHT on line 224-1 as arises at DTMF RECEIVER and FILTER 224 shown in FIG. 1a). The 8 BIT PROCESSOR Z80 CPU 202-2 (shown in FIG. 2a) sets the 4-BIT LATCH 175 208-2 of the ENABLE REGISTER 208 to produce logically High signal (H) IN MUX CTRL on line 208-5 to a logical Low when it is desired to gain access to the filtered audio input data and to a logical High when it is desired to allow access to the high band-pass filtered audio input from the DTMF RECEIVER FILTER 224, line 224-1. The logical High signal (H) IN MUX CTRL controls the analog multiplexor 218-2.

Continuing with FIG. 2e, the audio microprocessor program memory AP 8K×8 PROM 210, previously seen in FIG. 1a, is shown to be composed of 8K×8 ERASABLE PROM IN2764 210-2 manufactured by Intel. Selected ones of the addressing signals (H) ADDR 0 through (H) ADDR 13 and logically Low signal (H) ADDR 14 on the bus 202-1, plus logically Low signal (L) MEM REQ on line 207-7-7, all such signals as originate at the 8 BIT PROCESSOR Z80 CPU 202-2 shown in FIG. 2a, enable addressing of 8K×8 ERASABLE PROM IN 210-2 for production of an 8 bit data word as signals (H) DATA 0 through (H) DATA 7 on cable 202-3. Such a data word as received at 8 BIT PROCESSOR Z80 CPU 202-2 (shown in FIG. 2a) is the microinstruction word.

Figure 2F:
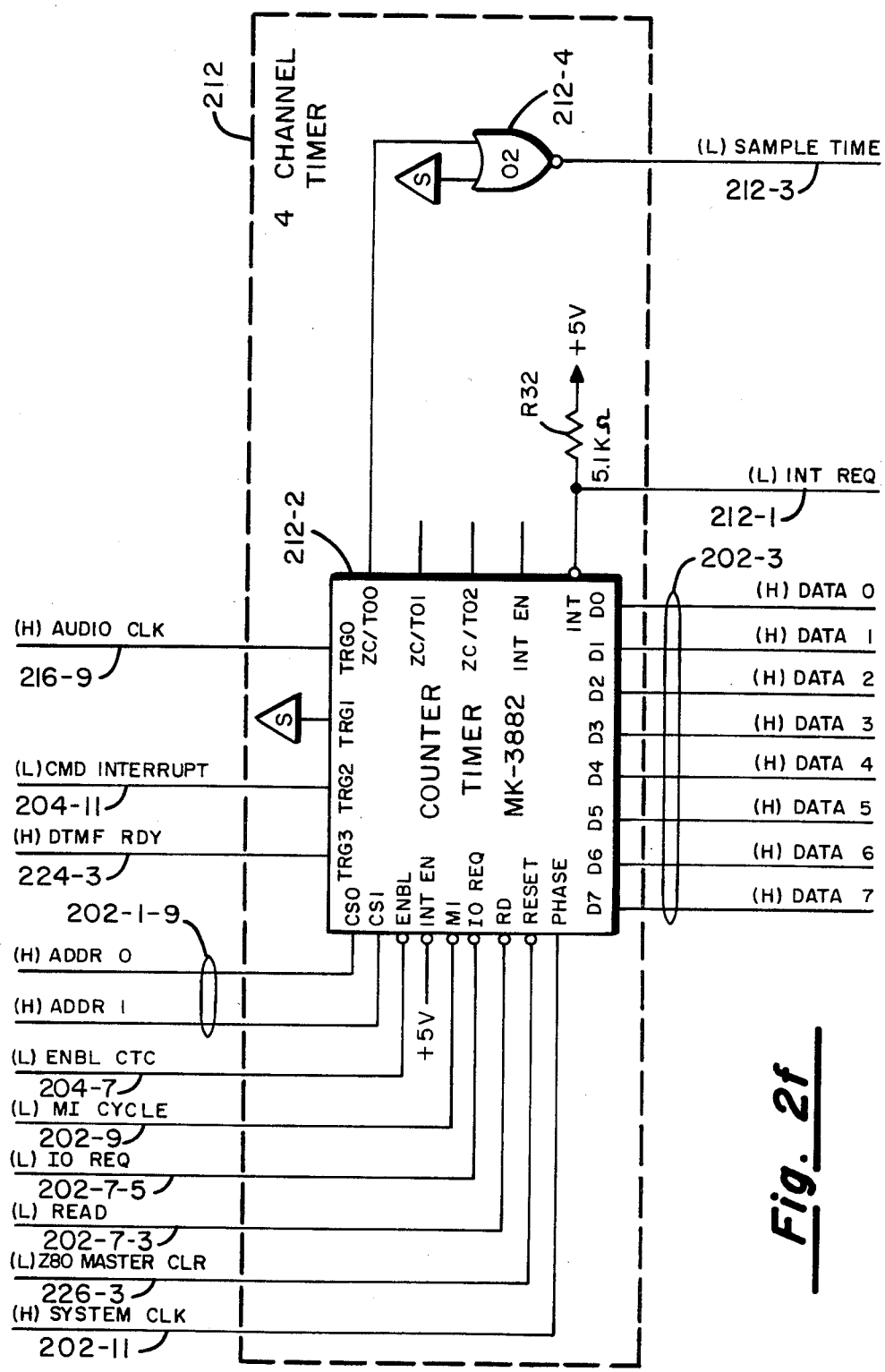
FIG. 2f shows a schematic diagram of the 4 CHANNEL TIMER part of the circuit of the device of the present invention.

Continuing with FIG. 2f, the 4 CHANNEL TIMER 212 previously seen in FIG. 1a may be observed to be primarily composed of COUNTER TIMER MK-3882 212-2 which is manufactured by Mostek. The function of this complex, monolithic integrated circuit, programmable device is best referenced in the manufacturer's specification. The COUNTER TIMER MK-3883 possesses 4 output channels, one of which, as amplified in 2-INPUT POSITIVE-NOR gate 212-4, is distributed as signal (L) SAMPLE TIME on line 212-3. This signal (L) SAMPLE TIME on line 212-3 is, by momentary reference to FIG. 2h, the signal which will be utilized in the development of the transmit and receive synchronization timing in the XMIT/RCV SYNCS 216 logics. In turn, the transmit and receive synchronization developed in XMIT/RECV SYNCS 216 will be received by the AUDIO CODER/DECODER 218 (reference FIG. 2i) for timing of the digital-to-analog, and analog-to-digital, conversion occurring within the (greek letter) mu LAW COMPANDING CODEC MK5116 218-04 (shown in FIG. 2i). Returning to FIG. 2f, the manner by which COUNTER TIMER MK-3882 212-2 does develop that first output channel time signal resulting insignal (L) SAMPLE TIME on line 212-3 is a function of the programming of such COUNTER TIMER MK-3882 212-2. Signal (H) SYSTEM CLK on line 202-11 is a 4 megahertz system clock and signal (H) AUDIO CLK on line 216-9 is, as will later be shown in discussion of the XMIT/RCV SYNCS 216 logics shown in FIG. 2h, a 2 megahertz clock signal. Either of these clocks may be programmed to cause the generation of (L) SAMPLE TIME on line 212-3. Signal (H) DTMF RDY on line 224-3 represents when, logically High going, the receipt of an interrupt from the DTMF RECEIVER 224 section (shown in FIG. 2l) which indicates the presence of a DTMF signal on the telephone interface. Signal (L) CMD INTERRUPT on line 204-11, as arose at the READ/WRITE ENABLE 204 shown in FIG. 2b, represents a "command interrupt" from the RMF BUS COMMUNICATION MICRO PROCESSOR (RP) 102 (shown in FIG. 1a) to the AUDIO MICRO PROCESSOR (AP) 202 (shown in FIG. 1a). All such interrupts, when synchronized with the system clock, result in the logical Low signal (L) INT REQ on line 212-1, such signal as is received by the 8 BIT PROCESSOR Z80 CPU 202-2 (reference FIG. 2a). The microprogram operating in such 8 BIT PROCESSOR Z80 CPU 202-2 (reference FIG. 2a) sets, via signals (H) DATA 0 through (H) DATA 7 on line 202-3 a basic, first channel counter within the COUNTER TIMER MK-3882 212-2 t count 41 hexadecimal times 256 decimal counts (such counts as may be programmably selectively based on either of the clocks but, at this value, which is based upon the system clock) as delay to the development of that first channel signal which ultimately results in signal (L) SAMPLE TIME on line 212-3 from the occurrence of an interrupt. The manner by which the COUNTER TIMER MK-3882 212-2 of the 4 CHANNEL TIMER 212 is controlled in order to effect transmit and receive synchronization and sample timing is shown in the timing diagram of FIG. 3 and will be further discussed in conjunction with that figure.

Figure 2G:
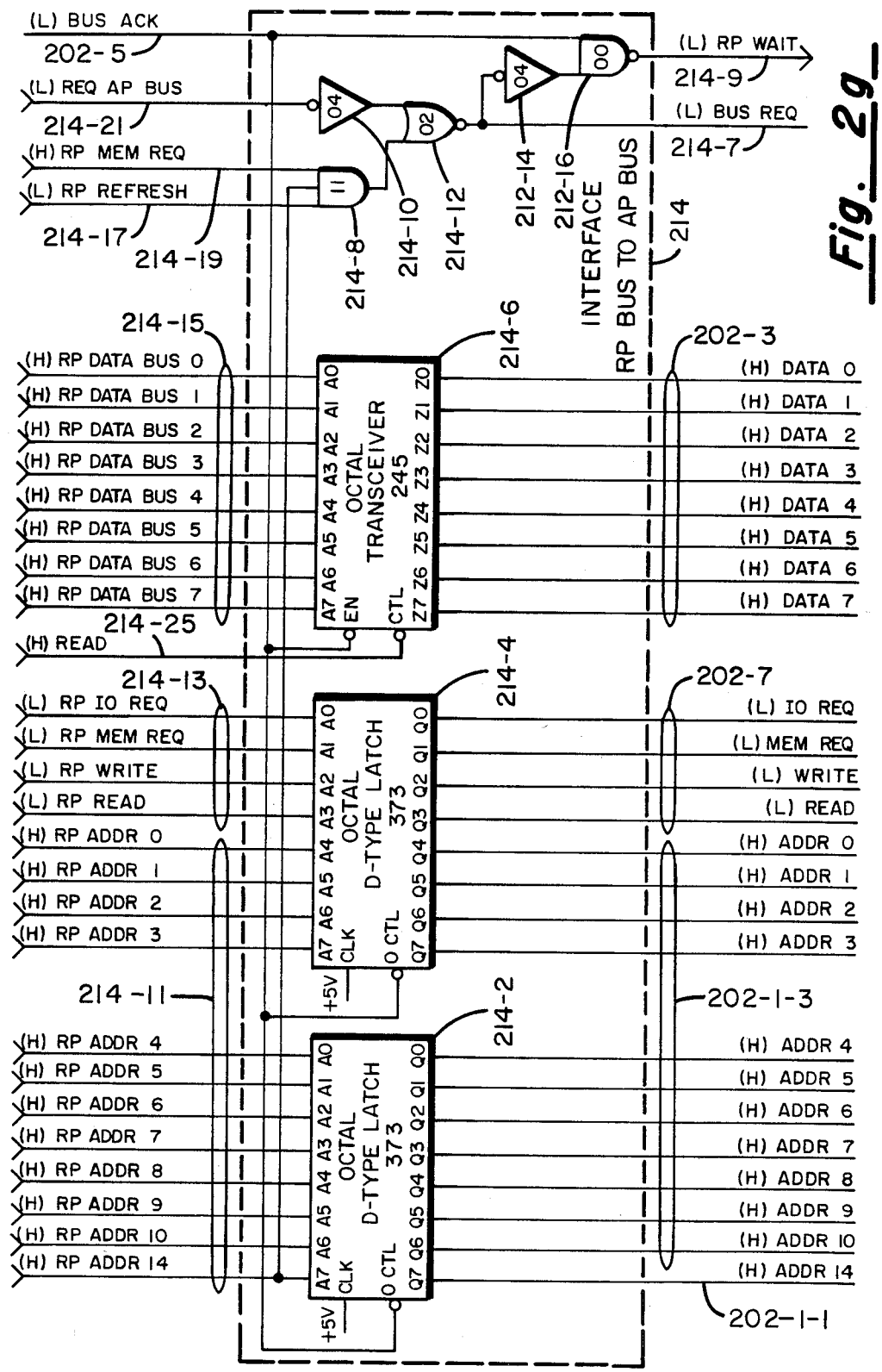
FIG. 2g shows a schematic diagram of the INTERFACE RP BUS TO AP BUS logics of the circuit of the device of the present invention.

Continuing with FIG. 2g, the INTERFACE RP BUS TO AP BUS 214 previously seen in the block diagram of FIG. 1a is shown. All input signals to the logics of this section, with the exception of signal (L) BUS ACK on line 202-5, are arrow tipped in indication that they arise outside of the logics of the speech sampling and companding device. Signals (H) RP DATA BUS 0 through (H) RP DATA BUS 7 on cable 214-15 are the data bits of the RP BUS 103 previously seen in FIG. 1b. Similarly, signals (H) RAP ADDR 0 through (H) RP ADDR 14 on cable 214-11 are the addressing lines of the RP BUS 103. The remaining signals on cables 214-13 and line 214-17, 214-19, and 214-21 are control signals of RP BUS 103. The signals are labelled in like correspondence to the signals arising at the AUDIO MICRO PROCESSOR (P) 202 as shown in FIG. 2a in order that it may be recognized that such signals are generated by the other microprocessor within the voice I/O module, the RMF BUS COMMUNICATON MICRO PROCESSOR (RP) 102 shown in FIG. 1b. The logical Low condition of signal (L) REQ AP BUS on line 214-21 as inverted in INVERTER 214-10 will satisfy 2-INPUT POSITIVE-NOR gate 214-12, resulting in logical Low signal (L) BUS REQ on line 214-7. The inversion of this logically Low signal (L) BUS REQ on line 214-7, as inverted by INVERTER 214-14, will satisfy, during the logical High duration of signal (L) BUS ACK on line 202-5, 2-INPUT-POSITIVE-NAND gate 214-16 resulting in logical Low signal (L) RP WAIT on line 214-9. As indicated by the arrowtip, this signal (L) RP WAIT on line 214-9 is routed to the RMF BUS COMMUNICATION MICRO PROCESSOR (RP) 102 (shown in FIG. 1b) to cause it to hold all data and control until the AUDIO MICRO PROCESSOR (AP) 202 (shown in FIG. 1a) can respond to the request for the AP BUS registered by the logical Low condition of signal (L) BUS REQ on the line 214-7. At such time as the AUDIO MICRO PROCESSOR (AP) 202 (shown in FIG. 1a and FIG. 2a ) responds with the logical Low condition of signal (L) BUS ACK on line 202-5, 2-INPUT-POSITIVE-NAND gate 214-16 will fail to be satisfied resulting in logical High signal (L) RP WAIT on line 214-9. This "handshake" protocol thus enables communication between the RMF BUS COMMUNICATION MICRO PROCESSOR (RP) 102 on the RP BUS 103 and the AUDIO MICRO PROCESSOR (AP) 202 on the AP BUS 202-1 and 202-3 (both of which are shown in FIG. 1). The logical Low occurrence of signal (L) BUS ACK on line 202-5 also enables OCTAL D-TYPE LATCH 373 214-2 and 214-4 to gate the control and address signals, respectively received on cables 214-13 and 214-11, to cables 202-7, 202-1-3 and 202-1-1. If signal (H) READ on line 214-25, such as arises at the RMF BUS COMMUNICATIONS MICRO PROCESSOR (RP) 102 (shown in FIG. 1b) is a logical Low, then the logical Low occurrence of signal (L) BUS ACK on line 202-5 will gate the data on cable 202-3—the data of the AP BUS—to cable 214-15 as RP BUS data. Conversely, if signal (H) READ on line 214-25 is logically Low, OCTAL TRANSCEIVER 245 214-6 will serve to gate the data of the RP BUS on cable 214-15 to the AP BUS as signals (H) DATA 0 through (H) DATA 7 on cable 202-3.

Figure 2H:
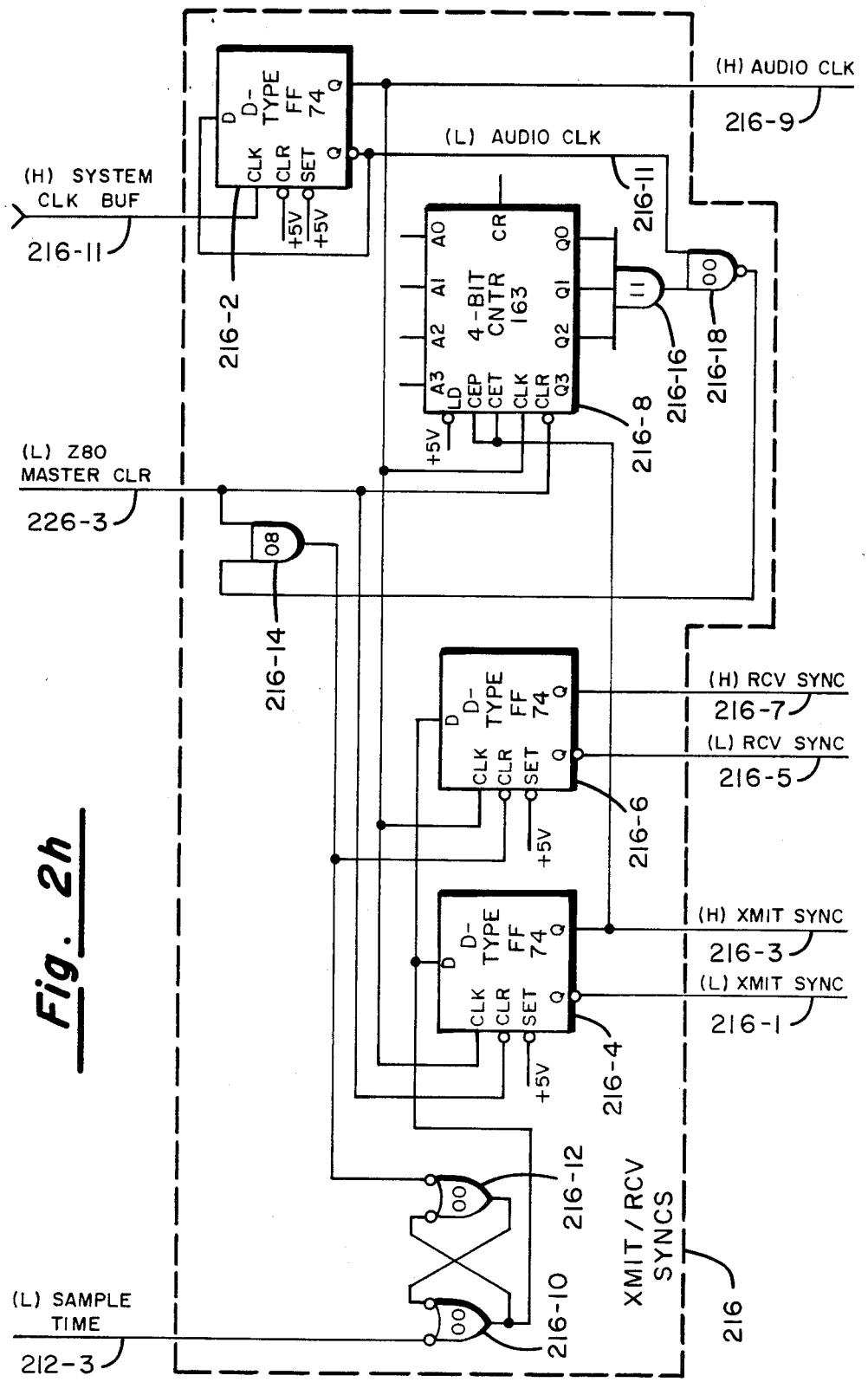
FIG. 2h shows a schematic diagram of the transmit/receiver synchronization (XMIT/REV SYNCS) logics of the circuit of the device of the present invention.

Continuing in FIG. 2h, the XMIT/RCV SYNCS 216 is shown as the transmit and receive synchronization first logical subsection part of the overall D/A AND A/D 216, 218, and 222 logical section shown in the block diagram of FIG. 1a. Signal (H) SYSTEM CLK BUF on line 216-11 is received into D-TYPE FF 74 216-02 as an external, system, 4 megahertz clock. Signal (H) AUDIO CLK on line 216-9 developed therefrom is exactly one-half that frequency, or 2 megahertz. The logical Low condition of signal (L) SAMPLE TIME on line 212-3 is latched in the latch consisting of cross-coupled 2-INPUT POSITIVE-NAND gates 216-10 and 216-12 in order that the sample time signal may be guaranteed to be gated by the logical High occurrence of signal (H) AUDIO CLK on line 216-9, which audio clock signal is the main source of timing reference for audio to digital and digital to audio conversion within the speech sampling and companding device. The two D-TYPE FF 74 216-4 and 216-6 resepctively generate the transmission and receive synchronizations to the (greek letter) mu LAW COMPANDING CODEC MK5116 218-04 of the AUDIO CODER/DECODER 218 shown in FIG. 2i. The logical High condition of signal (H) AUDIO CLK on line 216-9 gates the set side of the sample time latch, consisting of cross-coupled 2-INPUT POSITIVE-NAND gates 216-10 and 216-12, in order to accomplish the setting of D-TYPE FF 74 216-4 and 216-6 at the same, clocked sample, time. The logical High occurrence of signal (H) XMIT SYNC on line 216-3 triggers the 4-BIT CNTR 163 216-8, which counter is also clocked by signal (H) AUDIO CLK on line 216-9 at a 2 megahertz rate. When such 4-BIT CNTR 163 216-8 has counted to a binary 7, producing logical High Q0 through Q2 output signals, then 3-INPUT POSITIVE-AND gate 216-16 will be satisfied producing a first logical High signal into 2-INPUT POSITIVE NAND gate 216-18. Upon the logical High occurrence of signal (L) AUDIO CLK on line 216-11 (signal (H) AUDIO CLK on line 216-9 is logically Low), 2-INPUT POSITIVE-NAND gate 216-18 will be satisfied producing a logically Low first signal input into 2-INPUT POSITIVE-AND gate 216-14. Either this logically Low input, or the logical Low condition of signal (L) Z80 MASTER CLR on line 226-3, will dissatisfy 2-INPUT POSITIVE-AND gate 216-14 producing a logical Low signal which, when received as the CLR input, will immediately clear the D-TYPE FF 74 216-6. This logically Low signal arising from 2-INPUT POSITIVE-AND gate 216-14 will also clear the latch consisting of cross-coupled 2-INPUT POSITIVE-NAND gates 216-10 and 216-12, producing a logically Low set side output signal which, upon the next logical High occurrence of signal (H) AUDIO CLK on line 216-9, will clear the D-TYPE FF 74 216-4. Thusly, after a count of 7 cycles of the audio clock, the receive synchronization flip-flop latch—D-TYPE FF 74 216-6—will be immediately cleared and the transmit synchronization flip-flop—D-TYPE FF 74 216-4—will be cleared one-half audio clock cycle later.

Figure 3:
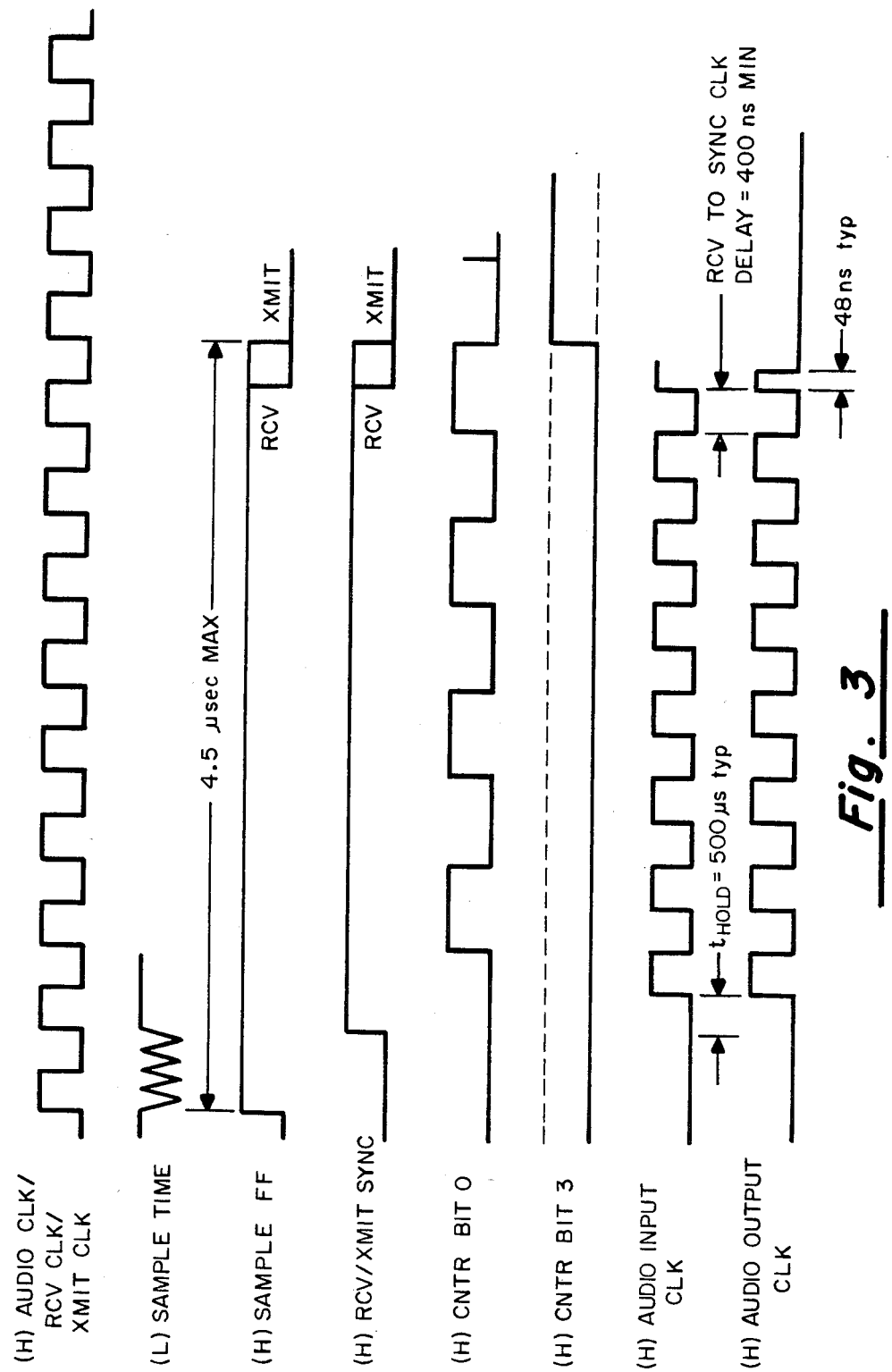
FIG. 3 shows a timing diagram of the operation of the circuit of the device of the present invention.

Momentarily referencing FIG. 3, this timing relationship of the XMIT/RCV SYNCS 216 functional logical subsection is shown. The 2 megahertz audio clock which is the received clock which is the transmit clock, such clock as appears on lines 216-9 and 216-11 in FIG. 2h, is diagrammed as signal (H) AUDIO CLK/RCV CLK/XMIT CLK. Signal (L) SAMPLE TIME, such as is shown to occur on line 212-3 in FIG. 2f and FIG. 2h, is intended to be illustrated to indeterminately occur anytime during an audio clock cycle. Since, by momentary reference to the COUNTER TIMER MK-3882 212-2 logic circuit of the 4 CHANNEL TIMER 212 shown in FIG. 2f, such signal (L) SAMPLE TIME is gated in development by signal (H) SYSTEM CLK on line 202-11, it is most logical to expect such signal to be logically Low going either after the rising or the falling edge of signal (H) AUDIO CLK/RCV CLK/XMIT CLK. The intent of the timing diagram of FIG. 3 is, however, simple to illustrate that signal (L) SAMPLE TIME is asynchronous with the audio clock. Signal (H) SAMPLE FF is, by momentary reference to FIG. 2h, the set side output signal of the latch consisting of cross-coupled 2-INPUT POSITIVE-NAND gates 216-10 and 216-12. The logical High condition of signal (H) SAMPLE FF will, upon the next logical high-going pulse of signal (H) AUDIO CLK/RCV CLK/XMIT CLK, produce logically High signal (H) RCV/XMIT SYNC. Signal (H) RCV/XMIT SYNC in the timing diagram of FIG. 3 is merely the composite of signal (H) RCV SYNC on line 216-7 and (H) XMIT SYNC on line 216-3 as are visible in FIG. 2h. Recalling by reference to FIG. 2h that the duration of these logically High synchronization signals was dependent upon the count of 4-BIT CNTR 163 216-8, signal (H) CNTR BIT 0 and signal (H) CNTR BIT 3 (shown in FIG. 3) represent the respective Q0 and Q3 output signals of such counter. Returning to FIG. 3, it may be observed by counting the number of toggles of signal (H) CNTR BIT 0 that when a count of 7 is obtained the signal (H) RCV/XMIT SYNC is, upon the next logical High occurrence of signal (H) AUDIO CLK/RCV CLK/XMIT CLK, logically Low going for the receiver synchronization, signal (H) RCV SYNC on line 216-7 as is represented by RCV in FIG. 3. As was taught in conjunction with FIG. 2h, signal (H) XMIT SYNC on line 216-3, represented by XMIT in the fourth timing line of FIG. 3 is logically Low going one-half audio clock cycle later. The signal (H) COUNTER BIT 3 is not utilized in the development of the synchronization signals (reference FIG. 2h) and may have the indeterminate state shown.

The final two signals (H) AUDIO INPUT CLK and (H) AUDIO OUTPUT CLK shown in FIG. 3 illustrate that, in conformance with the requirements of (greek letter) mu LAW COMPANDING CODEC MK5116 218-4 (shown in FIG. 2i), the audio clock signal does do logically High until approximately 500 nanoseconds after the synchronization signal (H) RCV/XMIT SYNC) has gone logically High. Also it is shown that the receive synchronization portion of the composite signal illustrated as (H) RCV/XMIT SYNC will remain logically High for at least 400 nanoseconds (actually it remains logically High for ½ clock cycle, or 500 nanoseconds) after the audio clock is logically Low going.

Figure 2I:
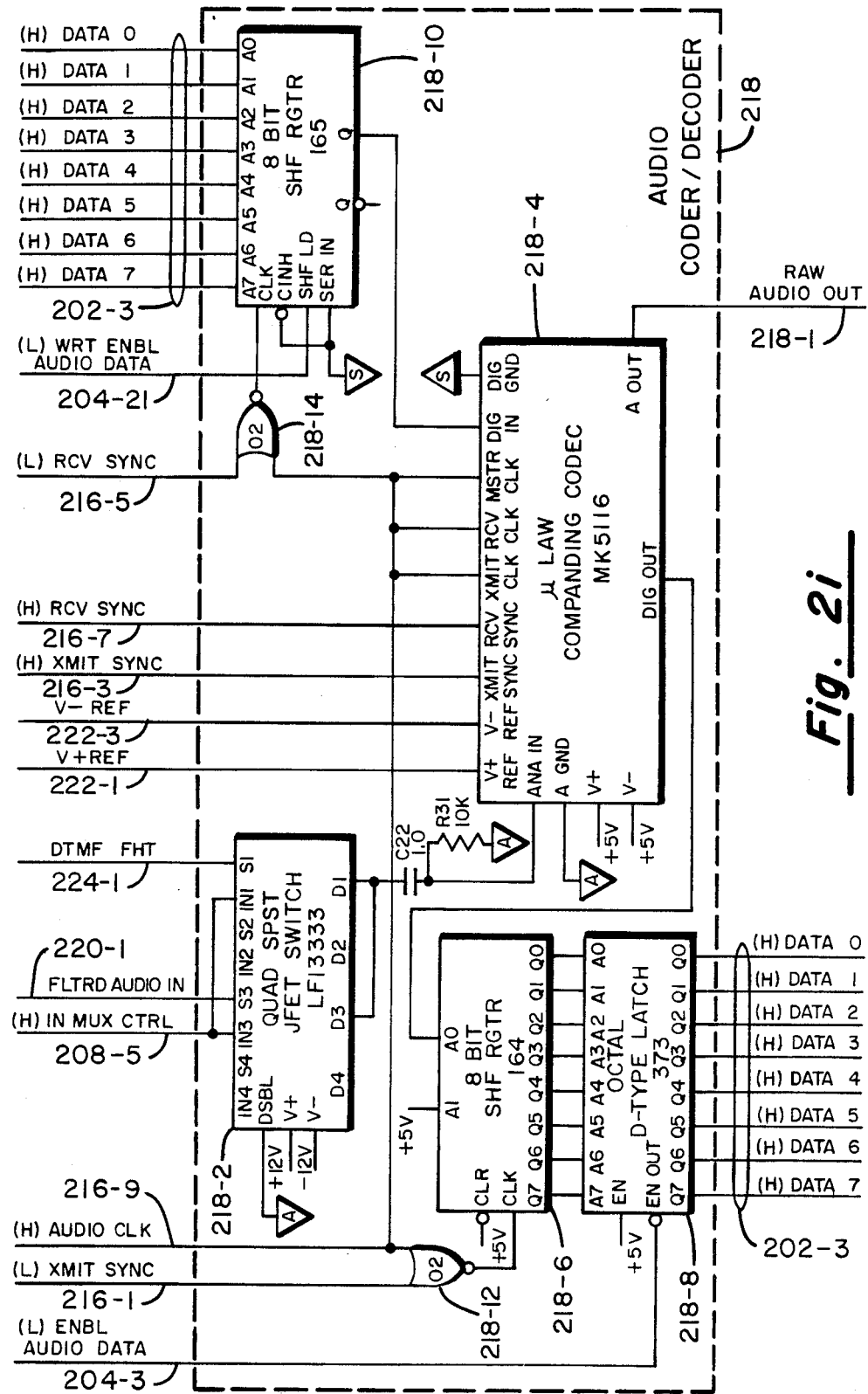
FIG. 2i shows the schematic diagram of the AUDIO CODER/DECODER circuit part of the circuit of the device of the present invention.

Continuing in the detailed explanation of the logics of the speech sampling and companding device, the AUDIO CODER/DECODER 218 functional subsection part of D/A AND A/D 216, 218, and 222 (previously seen within the block diagram of FIG. 1a) is shown in FIG 2i. The basic function of the AUDIO CODER/DECODER 218 circuit is to perform 8-bit digital-to-analog audio, and analog audio-to-8-bit digital, conversion in the (greek letter) mu LAW COMPANDING CODEC MK5116 218-4, which is manufactured by Mostek. In selection of the analog audio signal for encoding, signal (H) IN MUX CTRL on line 208-5 arising at the ENABLE REGISTER 208 seen in FIG. 2d, is used to select amongst signals FLTRD AUDIO IN on line 220-1 and DTMF FHT on line 224-1 in QUAD SPFT JFET SWITCH LF13333 218-2, which is manufactured by National Semiconductor. Switch 3 of the LF13333 device is normally closed, and switch 1 is normally open, requiring that the logical High condition of signal (H) IN MUX CTRL on line 208-5 to be present to select signal DTMF FHT on line 224-1. Referring momentarily to the 4 CHANNEL TIMER 212 logical subsection shown in FIG. 2f, unless the AUDIO MICRO PROCESSOR (AP) 202 (shown in FIG. 2a) has been alerted by the logical Low occurence of signal (L) INT REQ on line 212-1, (responsively to the logical High occurrence of signal (H) DTMF RDY on line 224-3 (the development of which as will be shown in conjunction with the DTMF RECEIVER 224 logical subsection shown in FIG. 2l) to the occurrence of a DTMF CONTROL SIGNAL), then signal (H) IN MUX CTRL on line 208-5 will be maintained in the logical Low condition. Returning to FIG. 2i, the selected signal from QUAD SPFT JFET SWITCH LF13333 218-2 is passed through a resistive capacitive filter consisting of R31 and C22 to be input to the (greek letter) mu LAW COMPANDING CODEC MK5116 218-4 as the ANA IN signal input. Under control of the logically High signal (H) RCV SYNC on line 216-7, and in consideration of the voltage references of V-REF on line 222-3 and V+REF on line 222-1 plus the signal (H) AUDIO CLK on line 216-9 (which is both the receiver and master clock), the (greek letter) mu LAW COMPANDING CODEC MK 5116 218-4 will digitalize such audio signal 1-bit at a time supplying such digitalized signal upon output DIG OUT to 8 BIT SHF RGTR 164 218-6. During the logical High condition of signal (L) XMIT SYNC on line 216-1, 2-INPUT POSITIVE-NOR gate 218-12 passes the 2 megahertz signal (H) AUDIO CLK on line 216-9 to clock the 8 BIT SHF RGTR 164 218-6 in the assembly of an 8-bit digital word representing the received audio signal. Such an assembled 8-bit digitalized audio signal is continually passed, in all bits, from 8 BIT SHF RGTR 164 218-6 to OCTAL D-TYPE LATCH 373 218-8 wherein it is logically held. The logically Low occurrence of signal (L) ENBL AUDIO DATA on line 204-3 enables the OCTAL D-TYPE LATCH 373 218-8, which is a buffer with tri-state output, to gate the digitalized word onto the AP BUS data portion as signals (H) DATA 0 through (H) DATA 7 on cable 202-3.

Continuing in FIG. 2i, an 8-bit digital word to be converted to audio data is gated as signals (H) DATA 0 through (H) DATA 7 on cable 202-3 (part of the AP BUS), from the AUDIO MICRO PROCESSOR (AP) 202 under the logical Low to High transition condition of signal (L) WRT ENBL AUDIO DATA on line 204-21. During the logical High condition of signal (L) RCV SYNC on line 216-5, 2-INPUT POSITIVE-NOR gate 218-14 is enabled to gate signal (H) AUDIO CLK on line 216-9 to be received at the 8 BIT SHF RGTR 165 218-10 as the shift clock. The successively shifted bits output from such 8 BIT SHF RGTR 165 218-10 are received at the (greek letter) mu LAW COMPANDING CDDEC MK 5116 218-4 as the digital input, DIG IN. During the logical High persistence of signal (H) XMIT SYNC on line 216-3, and in considertion of the voltage references and signal (H) AUDIO CLK on line 216-9 which is also the transmit clock (XMIT CLK input), the (greek letter) mu LAW COMPANDING CODEC MK5116 218-4 will convert such input digital signal to an analog output signal driven as signal RAW AUDIO OUT on line 218-1. Thusly, the AUDIO CONDER/DECODER 218 functional logical subsection is utilized for both transmitting (entailing digital-to-analog conversion) and receiving (entailing analog-to-digital conversion) of audio signals.

Figure 2J:
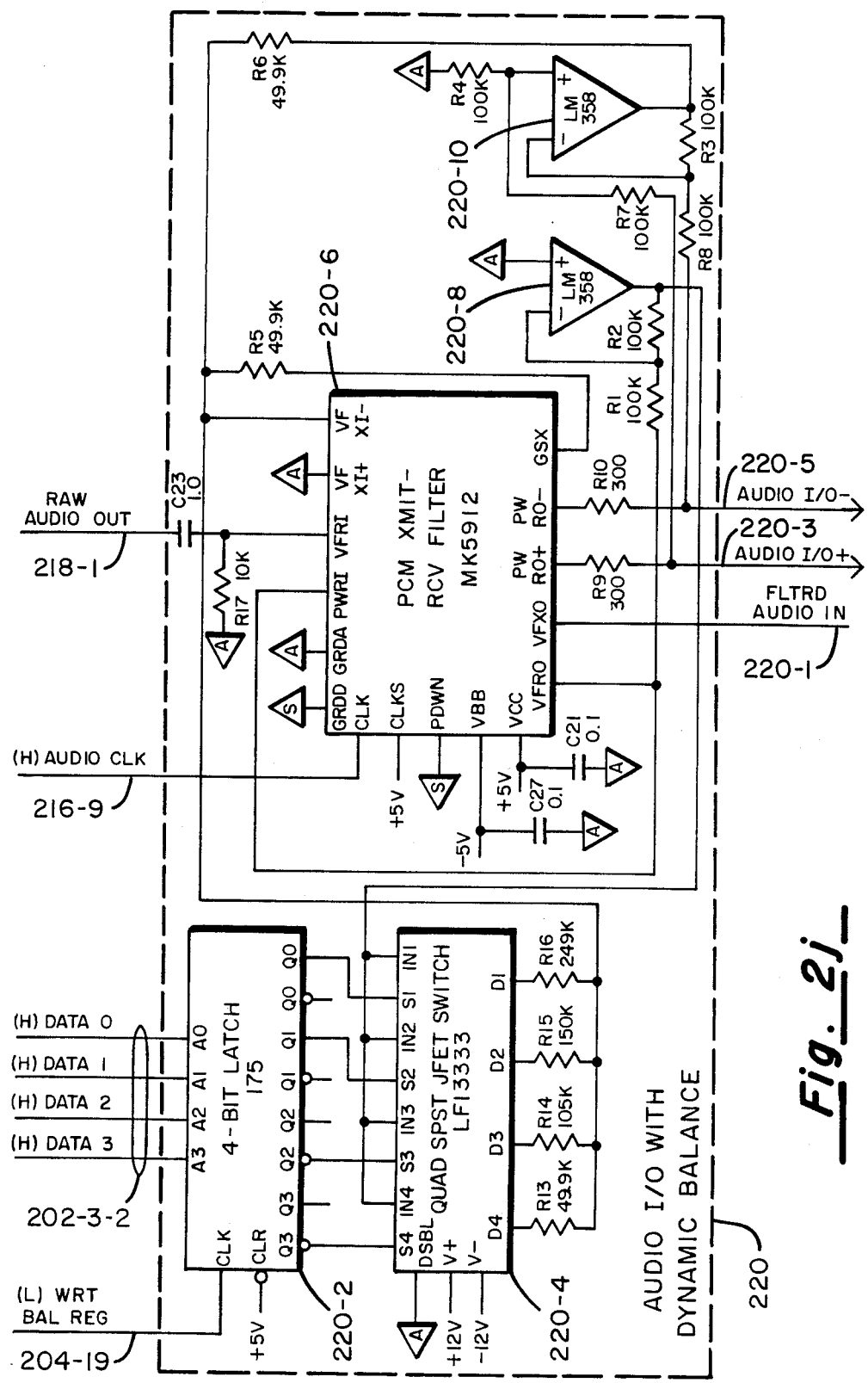
FIG. 2j shows the schematic diagram of the AUDIO I/O WITH DYNAMIC BALANCE circuit part of the circuit of the device of the present invention.

Continuing with FIG. 2j, the AUDIO I/O WITH DYNAMIC BALANCE 220 functional logical subsection shown therein was previously called FILTER AND 2 to 4 WIRE CONVERTER 220 within the block diagram of FIG. 1a. The circuit shown within FIG. 2j is a dynamically balanced 2 to 4 wire converter circuit which is described in U.S. patent application, Ser. No. 420,193 filed upon an even date with the present application and assigned to the same Assignee. The teaching of that application is expressly incorporated by reference within the present application. For completeness of the present application, pertinent parts of the teaching of that application will be restated as follows. The purpose of the AUDIO I/O WITH DYNAMIC BALANCE 220 functional logical subsection is to employ a dynamically balanced feedback arrangement wherein the 2 wire output signal consisting of signals AUDIO I/O on line 220-5 and AUDIO I/O+ on line 220-3 (such as connect to the TELEPHONE COUPLER or TRANSFORMER shown in FIG. 1a) may be cancelled at the 4 wire input signal FLTRD AUDIO IN on line 220-1. Such cancellation permits of the recognition of an input signal, such as control information in the form of DTMF signals, during the occurrence of output signalling, such as the transmission of audio information. Such balance attained by the feedback depends upon the load impedance presented to signals AUDIO I/O− on line 220-5 and AUDIO I/O+ on line 220-3. Because this load impedance may vary widely, and in time, in 2 wire telephone transmission systems the feedback of the AUDIO I/O WITH DYNAMIC BALANCE 220 logical circuit is subject to dynamic optimization under the control of the AUDIO MICRO PROCESSOR (AP) 202 (shown in FIG. 1a and FIG. 2a) so as to cause the 4-BIT LATCH 175 220-2 to contain a quantity which will optimize the feedback balance.

Continuing in FIG. 2j, the manner by which such feedback may be balanced is as follows. The signal RAW AUDIO OUT on line 218-1 is preliminarily filtered by capacitance C23 and resistor R17, and received as the VFRI signal input into the PCM XMIT-RCV FILTER MK5912 220-6. The VFRI analog signal input connects to a receive, low-pass, switch-capacitor, filter which will pass frequencies up to 3200 hertz and which exhibits unity gain over the pass-band. The specification of the manufacturer MOSTEK for the MK5912 device should be referenced. The signal output VFRO is the output of the low-pass filter and is capable of driving a high impedance electronic hybrid circuit. This signal is first routed to be connected, as the signal input PRWI, to dual power amplifiers available within the PCM XMIT-RCV FILTER MK5912 220-6 monolithic integrated circuit device. These dual power driver amplifiers provide a balanced, differential-output, signal capable of driving low impedance loads directly upon output ports PWRO+ and PWRO−. The series impedance load presented to these ports should be at least 600 ohms minimum; thusly resistances R9 and R10 of 300 ohms each are respectively inserted in series with the variable load impedance which connects to signals AUDIO I/O− on line 220-5 and AUDIO I/O+ on line 220-3.

Continuing in FIG. 2j, the VFRO signal output of PCM XMIT-RCV FILTER MK5912 220-6 is also fed, through biasing resistances R1 and R2, to operational amplifier LM358 220-8. The operation amplifier LM358 220-8 drives a variable impedance balance working network consisting of QUAD SPFT JFET SWITCH LF13333 220-4 and various switch-selected ones of resistances R13 through R16. Which, if any, of the normally open switches within the QUAD SPFT JFET SWITCH LF13333 220-4 will be enabled to pass the amplified signal output from VFRO through selected ones of resistance R13 through R16, and thence to a summing junction at resistance R5 and R6, is determined by the setting of the 4-BIT LATCH 176 220-5. Under the logically Low to High transition condition of signal (L) WRT BAL REG on line 204-19, signals (H) DATA 0 through (H) DATA 3 on cable 202-3-2 will selectively set or clear the 4-BIT LATCH 175 220-2 to a hexadecimal value of 0 through F. The clear side output signals of the 4-BIT LATCH 176 220-2 are received at the QUAD SPFT JFET SWITCH LF13333 220-4 to selectively enable the connection of certain ones of resistance R13 through R16 into that signal path proceeding from operational amplifier LM358 220-8 to the summing junction of resistors R5 and R6. The correlation between that hexadecimal value lodged in the 4-BIT LATCH 176 220-2 and that equivalent resistance connected by QUAD SPFT JFET SWITCH EF13333 220-4 in the feedback path proceeding from the signal output VFRO to the signal input VFXI− is shown in FIG. 3 of the aforementioned patent application, and may be calculated as the equivalent resistance of selected parallel ones of resistances R13 of 49.9K ohms, R14 of 105K ohms, R15 of 150K ohms, and R16 of 249K ohms. Such an equivalent resistance ranges from 25K ohms to 249K ohms. Such an equivalent resistance in the feedback loop will serve to balance a variable impedance load ranging from infinite to 69 ohms. In particular, a graduated, selectable, balancing of load impedances seen by signals AUDIO I/O− on line 220-5 and AUDIO i/O+ on line 220-3 between 69 ohms and 5.73K ohms is possible. That such cancellation or balancing, is dynamic is enabled by the fact that the AUDIO MICRO PROCESSOR (AP) 202 (shown in FIG. 1a and FIG. 2a) may execute an algorithm, such algorithm as is taught within the aforementioned patent application, to vary the hexadecimal contents of the 4-BIT LATCH 176 220-2, and thusly adjust the equivalent resistance in ohms within the feedback loop, responsive to observing that that component of signal RAW AUDIO OUT on line 218-1 which is detected within signal FLTRD AUDIO IN on line 220-1 should, via said adjustable feedback cancellation, be a minimum.

Continuing in FIG. 2j, the 2-wire type output signals AUDIO I/O− on line 220-5 and AUDIO I/O+ on line 220-3 are received at the differential amplifier LM358 220-10 through resistances R3, R4, R7, and R8, each of 100K ohms, which establish the equality of both such inputs and the unitary gain of such differential amplifier. The signal from differential amplifier LM358 220-10 is received by resistor R6, value 49.9K ohms, which forms a summing junction with those connected ones of resistances R13 through R16 as are connected within the feedback loop. The differential signal output between signals AUDIO I/O− on line 220-5 and AUDIO I/O+ on line 220-3 is effectively cancelled by this summing effect in the development of the VFXI− signal input, which signal input is the inverting input to an operational amplifier within the PCM XMIT-RCV FILTER MK5912 220-6. Such a summing effect cancellation does not occur, however, for signal FLTRD AUDIO IN on line 220-1 (which come into the speech sampling and companding device) because signal VFXO is isolated from signal input PWRO+ an PWRO− and does not respond to them. Thusly, the 4-wire type audio output signal RAW AUDIO OUT on line 218-1 will be cancelled, whereas any 2-wire type differential input signal carried upon full duplex communicative signal lines AUDIO I/O− 220-5 and AUDIO I/O+ 220-3 will appear, in the signal input VFXI−. This feedback cancellation enables full duplex signalling operations upon the 2-wire differential, telephone, system. When the feedback balancing is dynamic, as is permitted by the AUDIO I/O WITH DYNAMIC BALANCING 220 circuit, then reliable full duplex signalling operations may transpire over a wide range of variable load impedances, including the range of hundreds to thousands of ohms as is common for telephony networks.

Continuing in FIG. 2j, signal inputs VFXI— and VFXI+ are the respective inverting and non-inverting inputs of an operational amplifier within PCM XMIT-RCV FILTER MK5912 220-6. The output of this internal operational amplifier is passed through a band-pass filter which passes frequencies between 300 hertz and 3200 hertz, and which provides rejection of 50/60 hertz power line frequencies. Signal output VFXO is the analog signal output of this bandpass filter, with a voltage range of +2.5 volts and a d.c. offset of less than 250 millivolts. The signal FLTRD AUDIO IN on line 220-1 is eventually, within the AUDIO CODER/DECODER 218 functional logical subsection shown in FIG. 2i, supplied to the (greek letter) mu LAW COMPANDING CODEC MK5116 218-4.

Figure 2K:
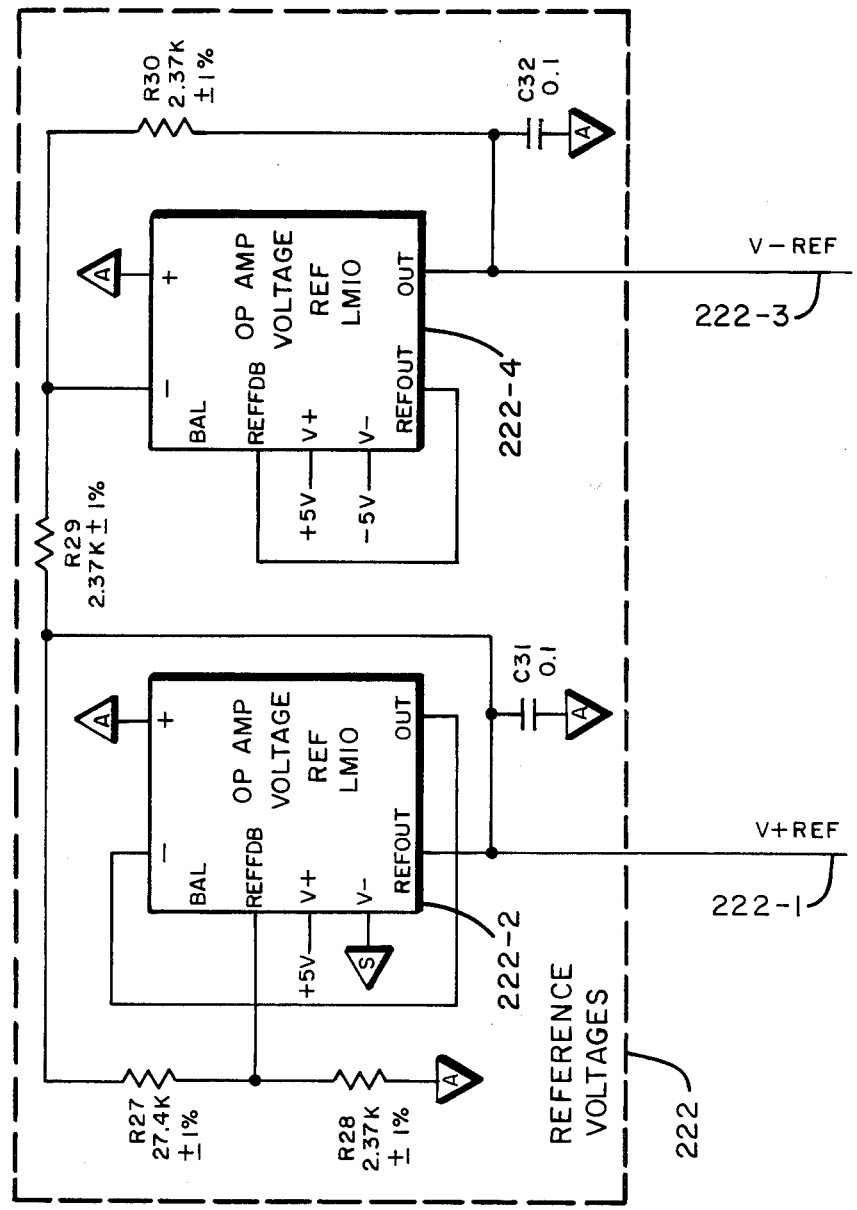
FIG. 2k shows the schematic diagram of the REFERENCE VOLTAGES supply circuit part of the circuit of the device of the present invention.
Figure 2M:
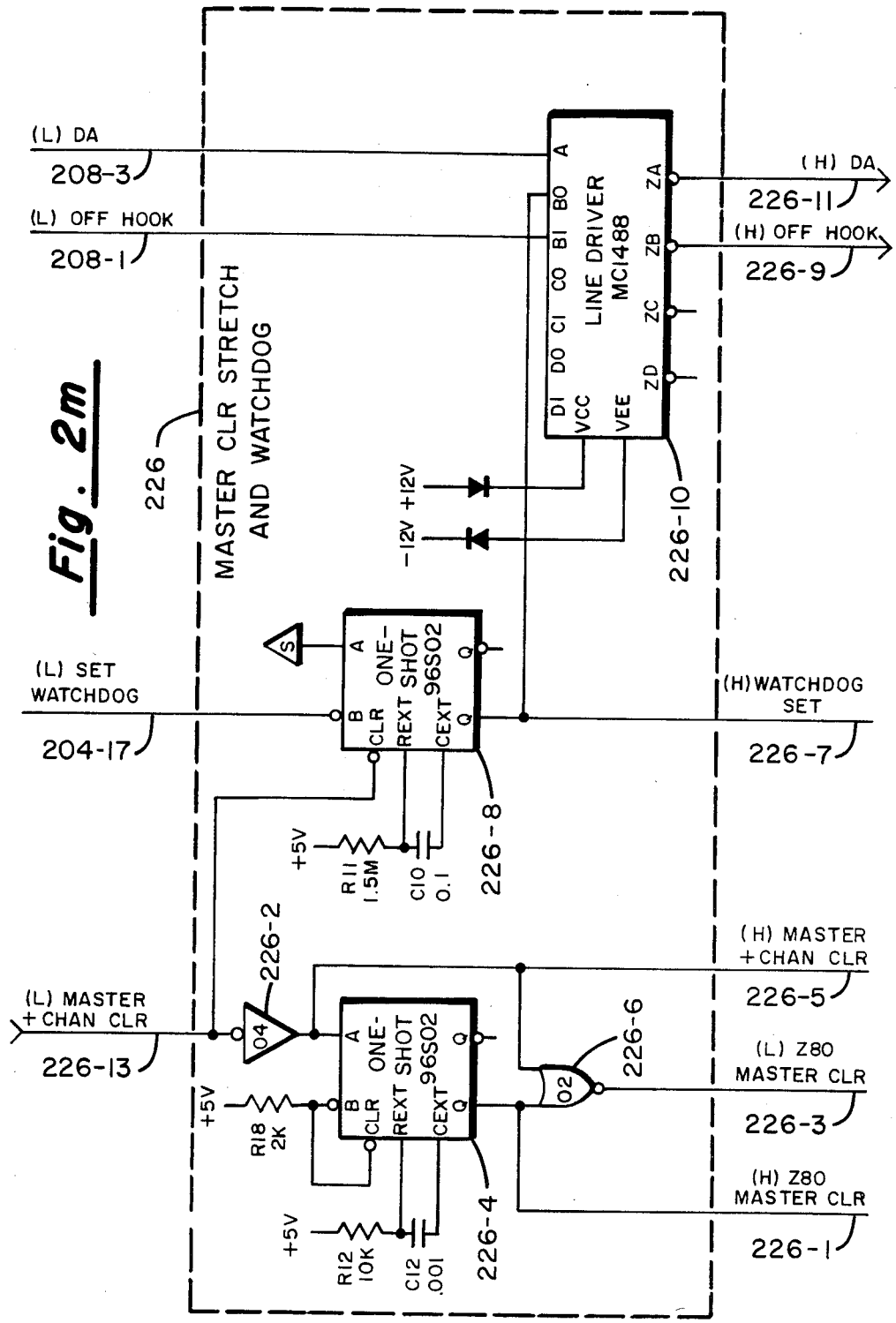
FIG. 2m shows the schematic diagram of the MASTER CLR STRETCH AND WATCHDOG logics of the circuit of the device of the present invention.

Continuing with FIG. 2k, section REFERENCE VOLTAGES 222 shown therein is concerned with the development of signals V-REF on line 222-3 and V+REF on line 222-1 which are supplied to the AUDIO CODER/DECODER 218 circuit shown in FIG. 2i. The reference voltage signals are derived from the OP AMP VOLTAGE REF LM10 222-2 and 222-4 which are suitably biased by one percent precision resistors R27 through R30 of the values shown. Capacitors C31 and C32 act as noise filter capacitors.

Continuing in the detailed logical explanation of the speech sampling and companding circuit the DTMF RECEIVER 224, previously seen as DTMF RECEIVER and FILTERS 224 in the block diagram of FIG. 1a, is shown in FIG. 2l. The filtered analog audio input signal, signal FLTRD AUDIO IN on line 220-1 is coupled through coupling capacitor C26, and filtered for high frequency transients by the resistive capactive network consisting of R 22 and C30, to DTMF FILTER MT8865 224-2 manufactured by Mitel. A frequency reference to such filter is created by resistor R21 in parallel with a 3.579 megahertz colorburst crystal Y1 type NDK0358. The DTMF FILTER MT8865 224-2 contains two band-pass filters plus amplification which generates, as outputs FL and FH, the two DTMF tones. A filtered analog output signal, noise suppressed by capacitor C20, is also driven as signal DTMF FHT on line 224-1. The two DTMF tone signals are received at the DTMF DECODER MT8862 224-4 which is manufactured by Intel. Such decoder circuit element produces, as signal outputs D1 through D4, four output signals which are the encoding of the DTMF control signal received. The network composed of R19, R20 and C28 (of values shown) constitutes the guard time circuit for the DTMF DECODER MT8862 224-4 circuit device. The DTMF DECODER MT8862 224-4 logical element also produces logical High signal (H) DTMF RDY on line 224-3 upon the detection, and encoding, of a DTMF CONTROL SIGNAL. The encoded DTMF CONTROL SIGNAL from the DTMF DECODER MT8862 224-4 is lodged in OCTAL D-TYPE LATCH 373 224-6. Additionally, logically High signals (H) CCT on line 224-7 and (H) RING INDICATOR on line 224-5, such signals as were previously seen within the block diagram of FIG. 1a as arising from the external TELEPHONE COUPLER CONTROL, are received and inverted in buffer amplifiers MC1489 224-8 and 224-10 and also become lodged in OCTAL D-TYPE LATCH 373 224-6. Upon the logical Low occurrence of signal (L) ENBL DTMF DATA on line 204-1, the contents of OCTAL D-TYPE LATCH 373 224-6 are gated as signals (H) DATA 0 through (H) DATA 7 onto cable 202-3 of the AP BUS.

The logical circuit of the speech sampling and companding device concludes with MASTER CLR STRETCH AND WATCHDOG 226 functional logical subsection shown in FIG. 2m. Externally received signal (L) MASTER +CHAN CLR on line 226-13, logically Low for the occurrence of power-up or command directed master clear, is approximately 200 nanoseconds in length. The buffered inversion of this signal in hex inverter 226-4 is distributed to speech sampling and companding device logics as signal (H) MASTER+CHAN CLR on line 226-5. The ONE-SHOT 96SO2 226-4, its pull-up connection to +5 V through R18, and its external resistive capacitance network consisting of R12 and C12, is involved solely in stretching the 200 nanosecond duration of the master clear pulse to approximately 5 microseconds as is required for the 8 BIT PROCESSOR Z80 CPU 202-2 (shown in FIG. 2a). The stretched, 5 microsecond, master clear signal is distributed as signal (H) Z80 MASTER CLR on line 226-1 and, as inverted in 2-INPUT POSITIVE-NOR gate 226-6, as signal (L) Z80 MASTER CLR on line 226-3. Signal (L) SET WATCHDOG on line 202-17 is periodically regularly emplaced in the logical Low condition when the AUDIO MICRO PROCESSOR (AP) 202 is operating. Resultantly ONE-SHOT 96SO2 226-8 maintains signal (H) WATCHDOG SET on line 226-7 in the logical High condition. Additionally, signal (L) DA on line 208-3 is itself inverted and driven as signal (H) DA on line 226-11. The effect of such watchdog circuit is to take the present speech sampling and companding device channel off hook in the event that AUDIO MICRO PROCESSOR (AP) 202 (shown in FIG. 2a) is not operating. This is necessary if a number of AUDIO I/O MODULES, as are associated with a number of audio channels, are present within a larger machine, and it becomes necessary to by-pass those modules upon which the microprocessors have stopped functioning.

Figure 5:
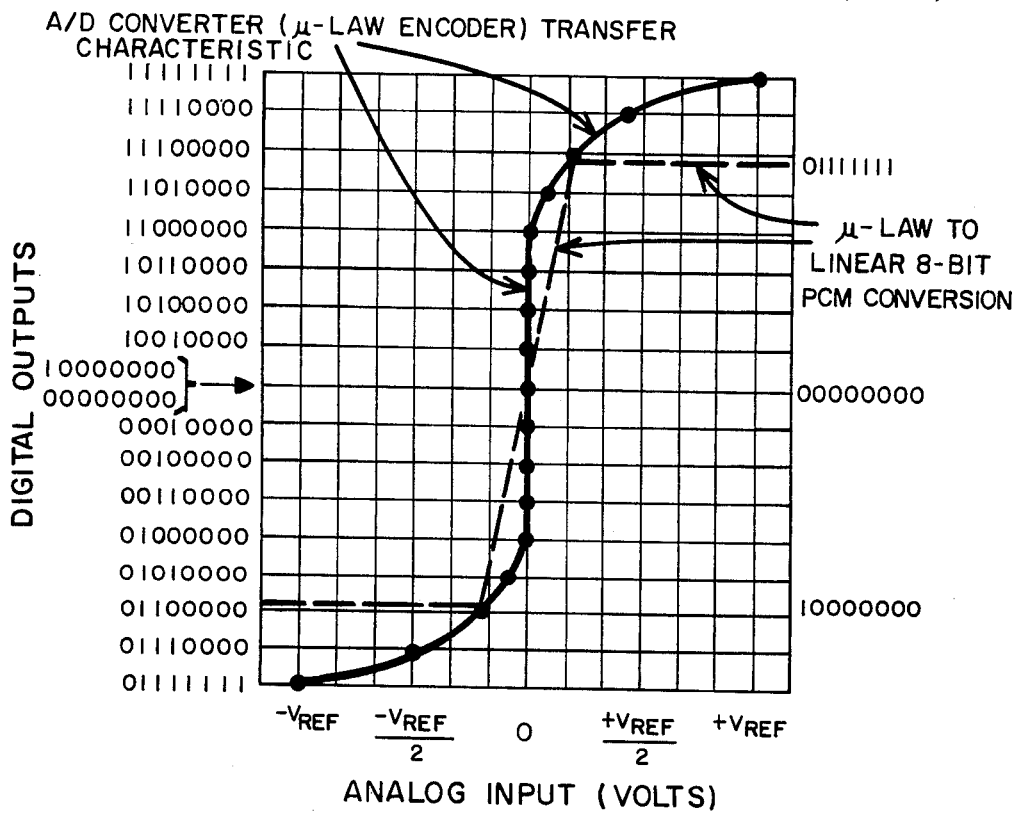
FIG. 5 shows the graphic relationship between the (greek letter) mu-Law CODEC analog/digital converter transfer characteristic and the linear conversion performed thereon by the circuit of the present invention.

In the implementation of analog-to-digital conversion in the speech sampling and companding device, a compounding CODer DECoder (CODEC) (greek letter) mu LAW COMPANDING CODEC MK5116 218-4 shown in FIG. 2i was chosen to be the analog interface device because it provides both analog-to-digital conversion and digital-to-analog conversion with one 16-pin integrated circuit. The digital outputs of the CODEC are three-field code words which cannot be used directly in signal-processing computations. A conversion to linear representation is performed by the microprocessor to an eight-bit, linear, two's complement representation which is directly proportional to the analog signal voltage. This conversion is performed by table lookup in the microprocessor's ROM memory (the AP 8K×8 PROM 210 shown in FIG. 2e). The eight-bit CODEC code word is used as a relative address into a table of 256 bytes. For output, another 256-byte table provides conversion from eight-bit linear representation to (greek letter) mu-law CODEC code words. The manner of this conversion is shown in FIG. 5, which shows the relationship between mu-law and linear conversion. There is some loss of information due to this conversion. The mu-law code has more resolution near zero, while the linear representation has redundant resolution at the outer extremes. In order to minimize the information loss, the linear encoding covers only about one-sixth of the CODEC's full input range. Amplitudes outside this range are clipped. This is permissable for voice signals because telephone circuit voice signals normally do not exceed an amplitude of −6 dBm. This holds the information loss due to linear conversion to less than one bit (of eight). Though small, this clipping is the largest source of quantization noise in the linear encoding process.

The implementation of Block-Scaled Pulse Code Modulation (BSPCM) is enabled in the present invention because the range of a speech signal varies slowly compared to its sampling rate. As a consequence, encoding the step size as well as the individual samples allows a reduction in total bit rate. The signal level increases along with the quantization noise level, thereby masking the noise. There are several adaptive coding schemes for speech which are based on this principle; Adaptive Differential Pulse Code Modulation (ADPCM) and Continuously Variable Slope Delta (CVSD) modulation, for example. One of the major disadvantages of adaptive coding schemes is that the step size of each sample is computed from the step size and and magnitude of the preceding samples. When a bit error occurs, or if preceding information is missing, the step size information may be lost for the following syllable or word. The decoded speech may be badly distorted until a quiescence in the speech resets the step size to its minimum value. Also, data cannot, in general, be edited or spliced and signal-processing operaions (gain control, mixing, thresholding, etc.) cannot be performed on the data directly.

Pulse code modulation (PCM) encoding is especially desirable for editing, signal processing and signal detection because each sample is independent of preceding samples and it is directly proportional to the amplitude of the signal. Unfortunately, PCM coding generally requires about twice the bit rate of the adaptive coding schemes for equivalent quality voice reproduction. The coding scheme presented here is also PCM because it is not adaptive—each sample is proportional to signal magnitude, not a function of the preceding history of the signal. But, like the adaptive coding schemes, it accomplishes a reduction in bit rate by adjusting the step size to follow the local dynamic range of the signal. Like PCM, BSPCM permits splicing and editing and signal processing functions to be readily performed on the signal.

BSPCM parses speech into contiguous short blocks. A common scale factor for the PCM samples in each block is computed from the range of the signal within the block. This scale factor is stored within the block. Conversion of each sample back to its absolute amplitude is accomplished by multiplying the sample code word by the scale factor.

Listening tests have shown that BSPCM has the same subjective quality as ADPCM at the same bit rate. Compared to ADPCM, BSPCM has more step quantization noise but no slope-overload distortion.

Figure 4:
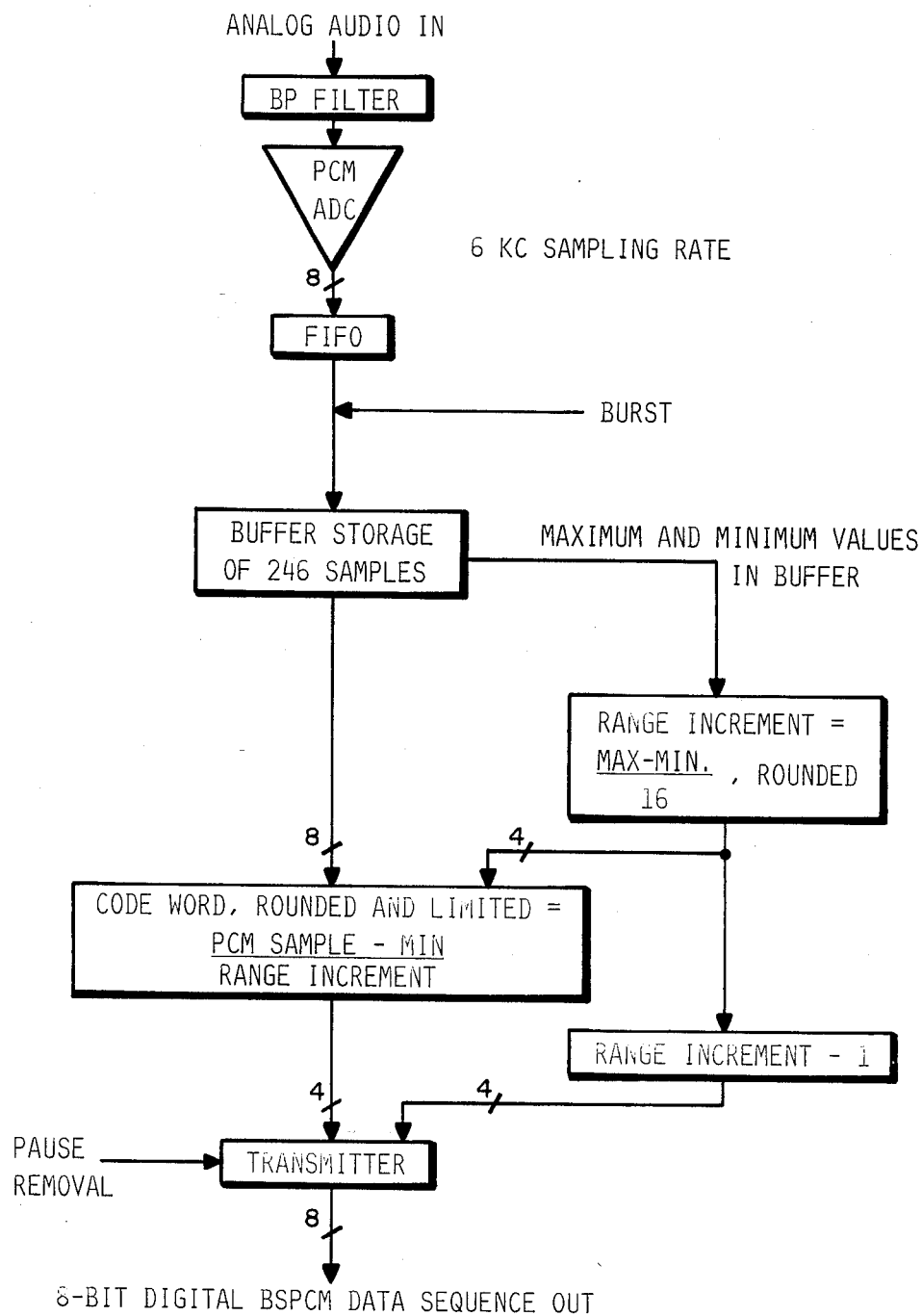
FIG. 4 shows a block diagram of the method of the Block-Scaled Pulse Code Modulation (BSPCM) speech encoding process of the present invention.
Figure 6:
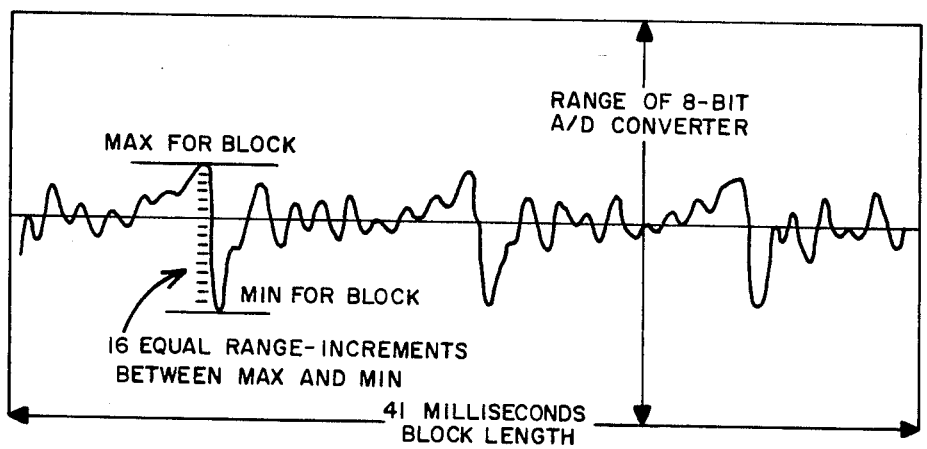
FIG. 6 shows a diagrammatic representation of the Block-Scaled Pulse Code Modulation (BSPCM) encoding of PCM data as is performed by the circuit of the present invention.

Encoding of the speech waveforms is shown in FIG. 4 and FIG. 6. It starts with a band-pass anti-aliasing filter and an eight-bit (greek letter) mu-law CODEC analog-to-digital converter. The mu-law code is converted by a microprocessor performing table lookup to eight-bit linear PCM.

A block of 246 eight-bit linear PCM samples representing 41 milliseconds of time is accumulated in a buffer (FIG. 4 and FIG. 6). The dynamic range of the data within the block, divided by 16 and rounded up if the remainder is nonzero, is the range increment, a common scale factor for the block. A four-bit code word for each sample is computed by dividing the eight-bit linear PCM sample by the four-bit range increment with rounding. This division is done by table lookup in a four-bit table of $2^{12}$ entries. FIG. 6 illustrates this process for a 41 millisecond segment of voiced speech containing three glottal pulses. Note that the voiced speech waveform in FIG. 6 is not symmetric about the time axis; the glottal pulse dips further below the axis than above it. This is typical of all voiced speech. The BSPCM encoding process accounts for this property of speech when estimating the range increment by referencing it to the minimum sample value in the block. It is obvious that such range increment could also have been referenced relative to the maximum sample value in the block. Before the block of data is transmitted for recording on disk, it is preceded by the minimum and the range increment and other control information as shown in FIG. 7.

Figure 8:
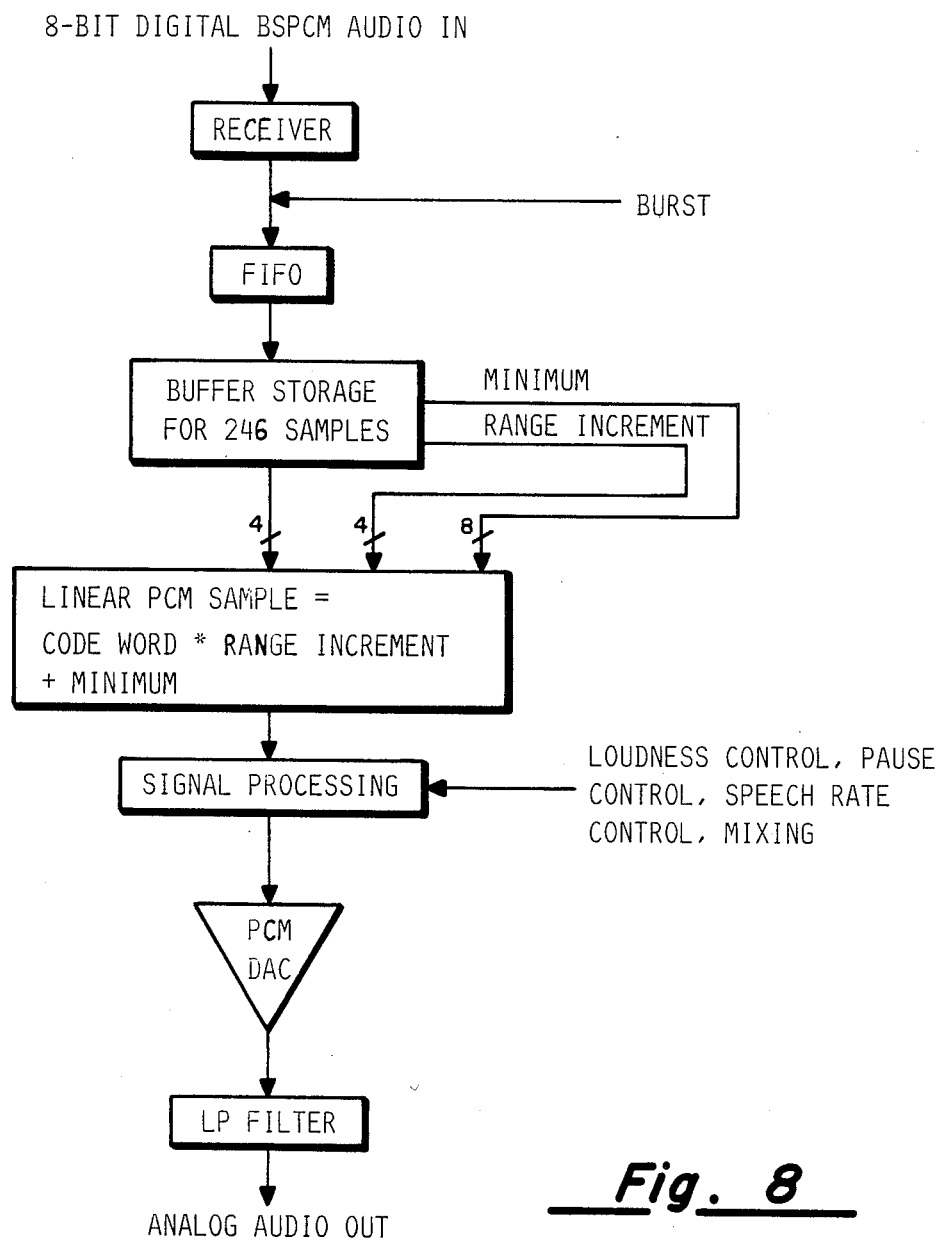
FIG. 8 shows a block diagram of the method of the decoding of Block-Scaled Pulse Code Modulation (BSPCM) digitally encoded speech signals.

Decoding is shown in FIG. 8. Decoding is performed by receiving the digital data, multiplying each four-bit code word by the four-bit range increment, and adding the eight-bit minimum. The eight-bit result is linear PCM which can have signal-processing operations performed upon it at this time.

Final conversion to analog audio involves translation to (greek letter) mu-law coding by table lookup and transmission of each mu-law sample to the CODEC D/A converter.

Note that the range increment is a measure of the signal energy level. this parameter is very useful for signal detection purposes.

The BSPCM block size was chosen to represent 41 milliseconds of time. The choice of 41 milliseconds is a compromise between many conflicting requirements. The following is a list of the major system performance factors that are affected by the BSPCM block size:
1. Indexing-Indexing through data tables by an 8-bit microprocessor requires double precision if the block size is greater than 256.
2. Speech Rate-The fastest speech rate will lose entire syllables if the block size is too large; or harmonic distortion, even pitch change, will occur if the block size is reduced too close to the glottal pulse period.
3. RAM Memory Size-Required buffer storage in RAM memory is proportional to block size. The audio processor is limited to 1K bytes of RAM memory.
4. Pause Removal-A block size too large would fail to remove intersentence pauses. A block size too small would distort unvoiced stops.
5. Noise Threshold-To detect and remove shorter pauses requires a higher energy threshold, but if the threshold becomes too high, low-energy phones would be lost. Thus, short blocks make the noise threshold more critical.
6. Noise sample-Longer blocks will better reproduce the background noises during pauses.
7. Quantization Noise-Signal-to-quantization noise ratio degrades badly for block sizes much greater than 30 milliseconds.
8. Disk storage-The percentage of the block devoted to control information accelerates significantly for block lengths less than 16 milliseconds.
9. Concatenation-Voice-response concatenation of words is affected by block size. The uncertainty in the time between words is equal to the block length. The interword rhythm will degrade as the block length increases.

10. Touch-Tone Removal-The most efficient algorithm for the removal of DTMF tones from digitized speech requires a block size slightly longer than the DTMF detector's minimum response time (30 milliseconds).

Control signal detection in the speech sampling and companding circuit of the present invention is accomplished by the DTMF DECODER MT8862 224-4 part of the DTMF RECEIVER 224 shown in FIG. 21. Thirty milliseconds after the appearance of a DTMF signal, the decoder will interrupt the microprocessor. The microprocessor will suspend any audio conversion in progress and pass the DTMF character on to the Central Processor Unit (CPU). If the audio card was encoding incoming audio at the time the DTMF interrupt occurred, it will discard the audio that was digitized 41-82 milliseconds prior to the interrupt, and it will wait until the DTMF tones have ceased before continuing either audio input or audio output.

The range increment parameter in each BSPCM block is a measure of signal amplitude. Comparing the range increment to a threshold can be used to detect pauses in speech being digitized. If the signal level falls below the pause threshold for a certain period of time, the flow of digitized audio to the CPU is stopped, but one block of digitized background noise is held in the audio card.

When the signal level rises above the noise threshold, the number of contiguous 41-millisecond intervals that were counted during the pause is stored in the background noise block and the noise block is transmitted to the CPU. Digitization continues until another pause is encountered. Pause removal tends to conserve disk storage.

On playback, the pause interval will be duplicated by repeating the background noise in the pause block—more times to slow the speaking rate, or fewer times to speed up the speaking rate.

Other telephone signals can be detected by measuring the power levels seen at the two analog outputs of the DTMF decoder. DAO is wide-band energy and FHO is band-pass filtered audio in the band 1162 to 1740 hertz. The following list shows the algorithms for detecting telephone signals:

Dial Tone: DAO has large energy present varying ±3 dB for more than 2 seconds.

Ringback: DAO energy present: 1 second on and 3 seconds off, or 2 seconds on and 2 seconds off, or 2 seconds on and 4 seconds off.

Busy (also all-trunks busy, PBX busy, timed-out sender, unassigned code dialed): DAO energy present: ¼ second on and ¼ second off, or ½ second on and ½ second off.

Speech or DTMF: FHO energy present for more than 200 milliseconds (indicates energy in the band of 1162 to 1740 hertz.)

Silence: DAO energy small for more than 4 seconds.

Energy detection consists of comparing the range increment values to a threshold. Dial tone, ringback, and busy all have frequency components below 1162 hertz.

The time required to detect a signal after the signal appears is as follows:
Dial Tone: 3 seconds
Ringback: 4 to 10 seconds
BUSY: ¾ second to 1½ seconds
Speech: 200 milliseconds
Silence: 4 seconds
Touch-Tone Character: 50 milliseconds.

Telephone calls may be placed by converting a digital encoding of Touch-Tone tones to analog audio. Being able to detect dial tone, ringback, busy, speech and silence permits monitoring the progress of dial-out. That is, totally automated placement of telephone calls can be performed by machine, with telephone line status being monitored along the way. (If the line is busy, the machine can call back later, for example.) When the called party answers, this event can be detected in one of three ways (in the likelihood of occurrence):

1. Speech detected ("Hello"),
2. Ringback started, then stopped,
3. Detection of an incoming DTMF character.

Speech being output can be modified at a certain step in the decoding process (see FIG. 9).

Five levels of change of loudness can be imposed on the output speech via the following algorithms:

1. Softest: Right-shift the linear PCM samples two places with sign extension (12 dB decrease),
2. Soft: Right-shift the linear PCM samples in place with sign extension (6 dB decrease),
3. No Change: No shift,
4. Loud: Circularly left-shift the linear PCM one place with limiting (6 dB increase),
5. Loudest: Circularly left-shift the linear PCM two places with limiting (12 dB increase).

Speech Rate is controlled as follows:

1. Slowest: Increase the duration of all pauses and repeat each data block,
2. Slow: Increase the duration of all pauses,
3. No Change: Pause duration and speech rate unchanged,
4. Fast: Reduce all pauses to one data block (41 milliseconds),
5. Fastest: Reduce all pauses to one data block and discard up to two-thirds of the speech data in each block.

There is an upper limit to pause duration for the "slowest", "slow" and "no change" speaking rates. This limit is stored in a control memory location. It has a default value of four seconds, but it can be changed to any value up to ten seconds in 41-millisecond increments.

Mixing the speech being output can be accomplished by adding, sample by sample, a second signal. A warning tone is provided on the audio card that can be mixed with the output speech. This signal is stored on the audio card as a table containing eight samples of one period of a 750 hertz sine wave. The values are proportional to 0, $1/\sqrt{2}$, 1, $1/\sqrt{2}$, 0, $-1/\sqrt{2}$, $-1$, $-1/\sqrt{2}$. A value from this table is added to each linear PCM sample before the loudness adjustment is made. After each conversion the pointer into this table is incremented circularly.

The state transfer table, or diagram, of the microprogram operating within the AUDIO MICRO PROCESSOR (AP) 202 is shown in FIG. 9, consisting of FIG. 9a and FIG. 9b. Modes 0 through 7 show the eight operational states of the program, of which mode 4—TESTING is not dealt with within the present specification disclosure. The manner by which transfer between these self-explanatory operational states is obtained responsive to system occurrences—including the detection of a DTMF interrupt and the receipt of commands to stop, input, output, send DTMF control characters, or test—is represented at the intersections of the eight operational states and the six occurrences. As the state transfer table, FIG. 9 shows the microprogram response which will be assumed by the AUDIO MICRO PROCESSOR of the circuit of the present invention conditional upon the occurrence of any recognizable eventuality during any operational mode, or state.

Figure 10A:
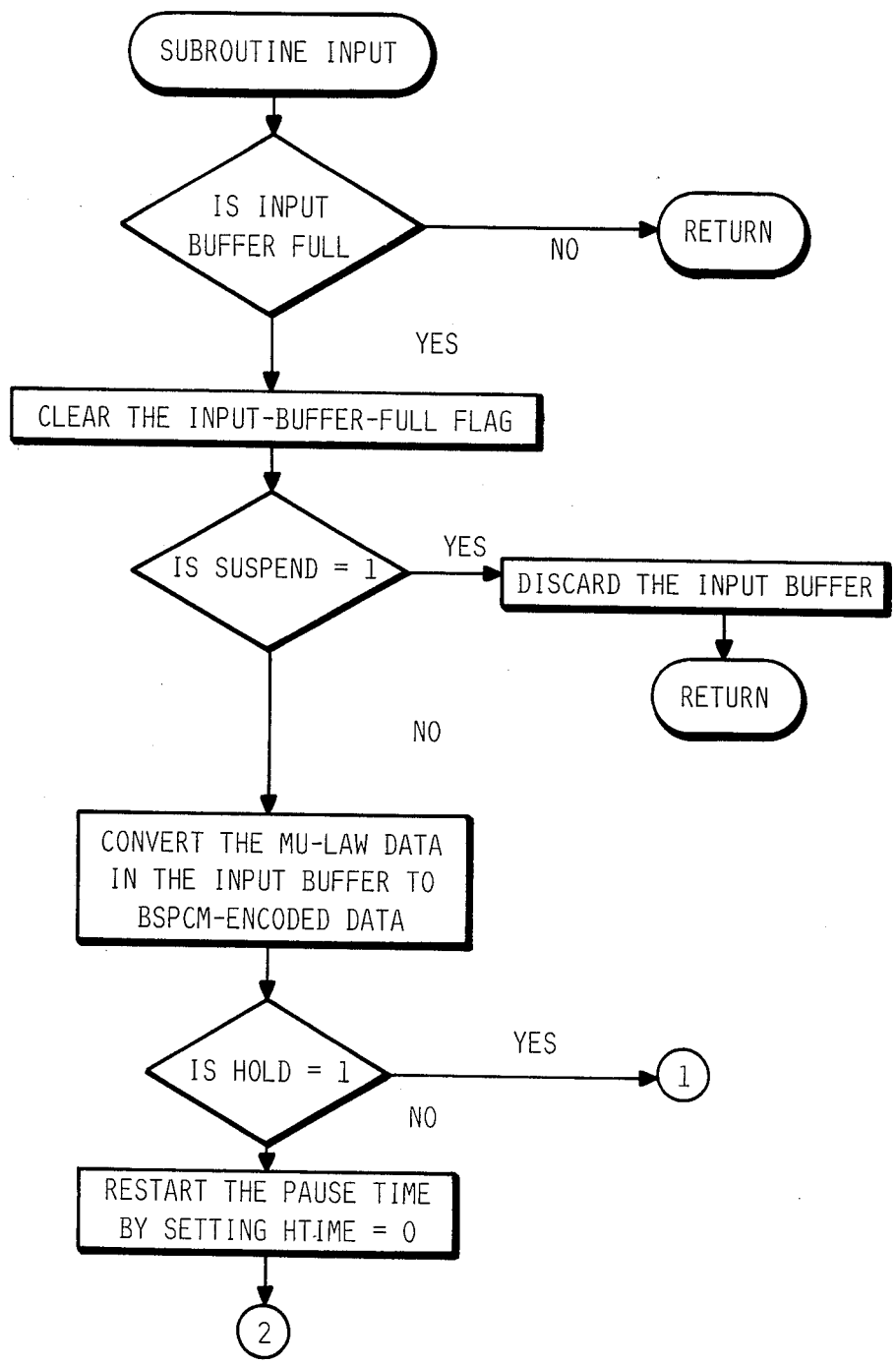
FIG. 10a through FIG. 10c, show the flowchart of the microprogram subroutine which accomplishes the input and BPSCM encoding of audio data by the circuit of the present invention.
Figure 10B:
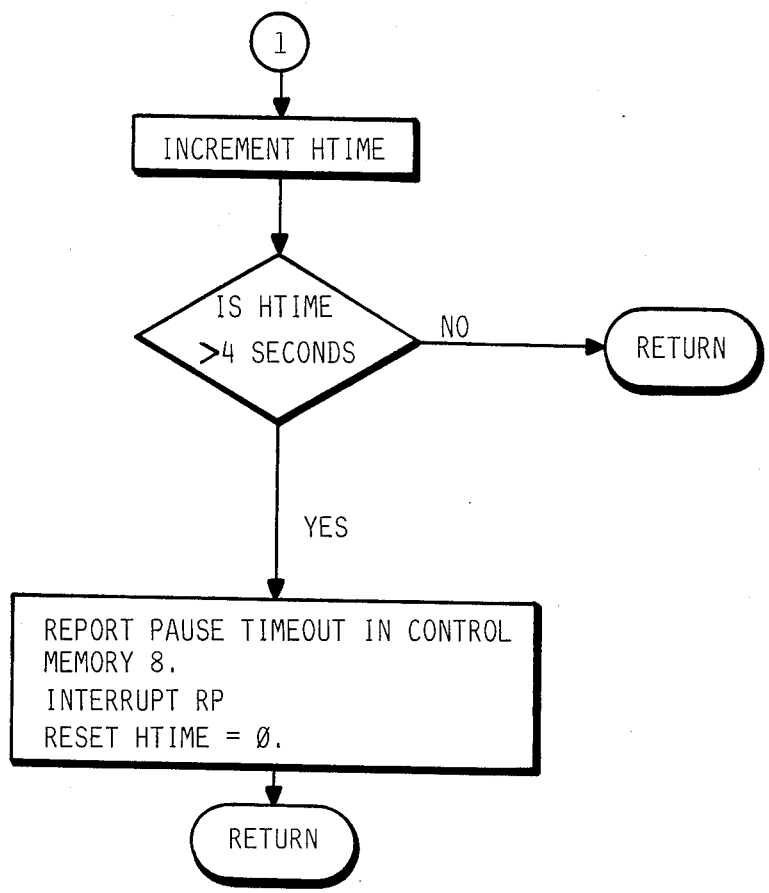
Figure 10C:
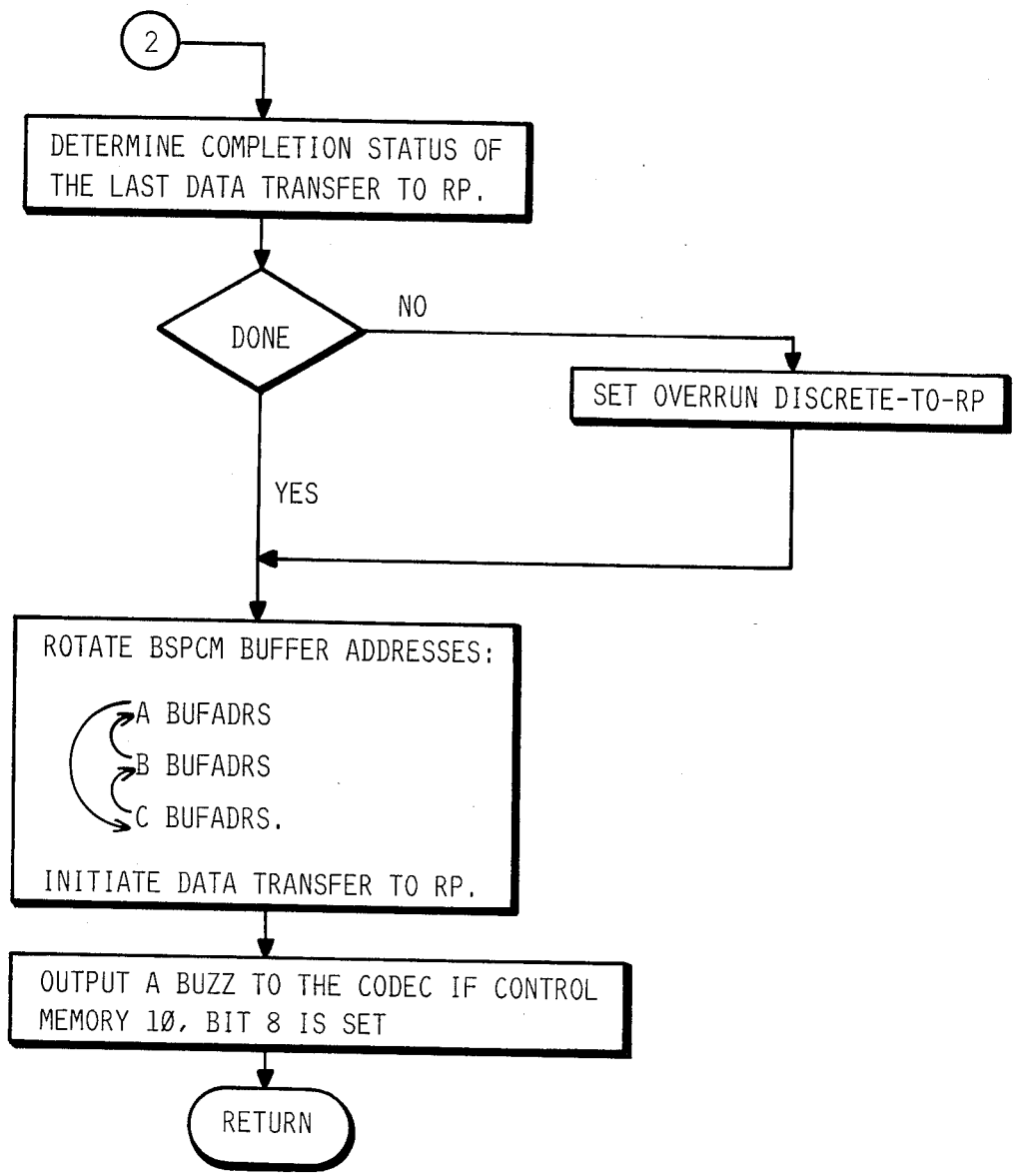
Figure 11A:
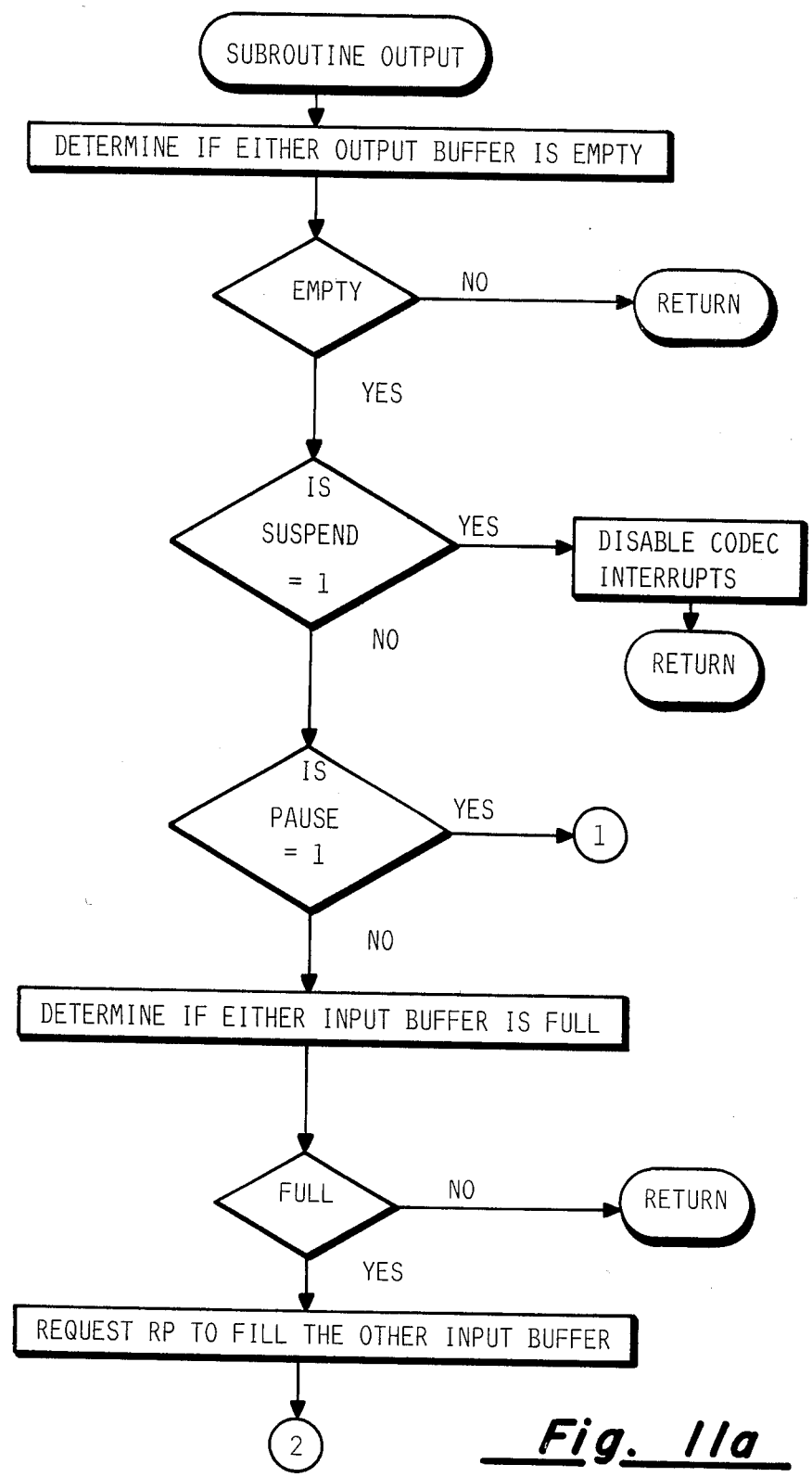
FIG. 11a through FIG. 11c show the flowchart of the microprogram subroutine such as accomplishes the decoding and output of BPSCM encoded audio data.
Figure 11B:
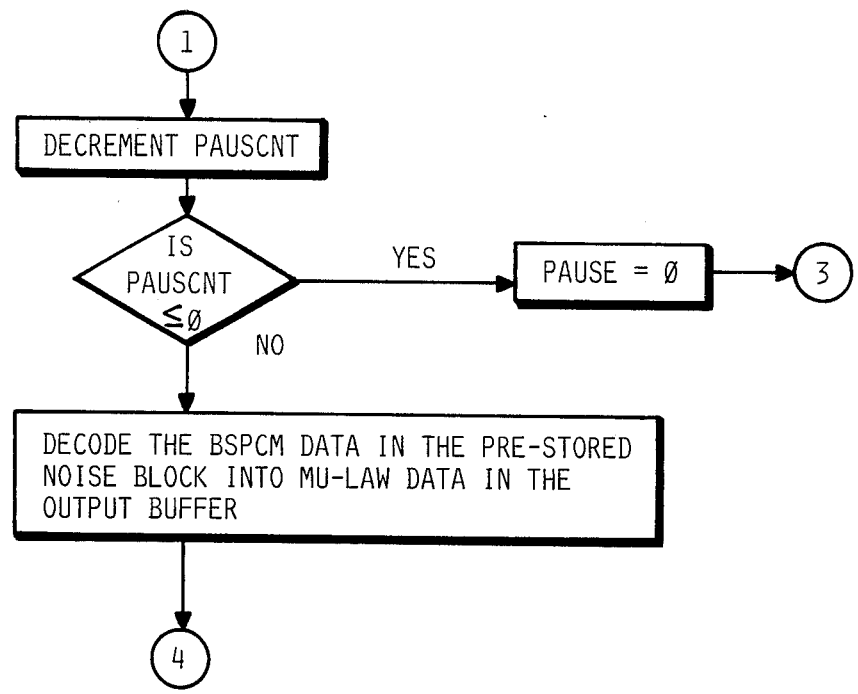
Figure 11C:
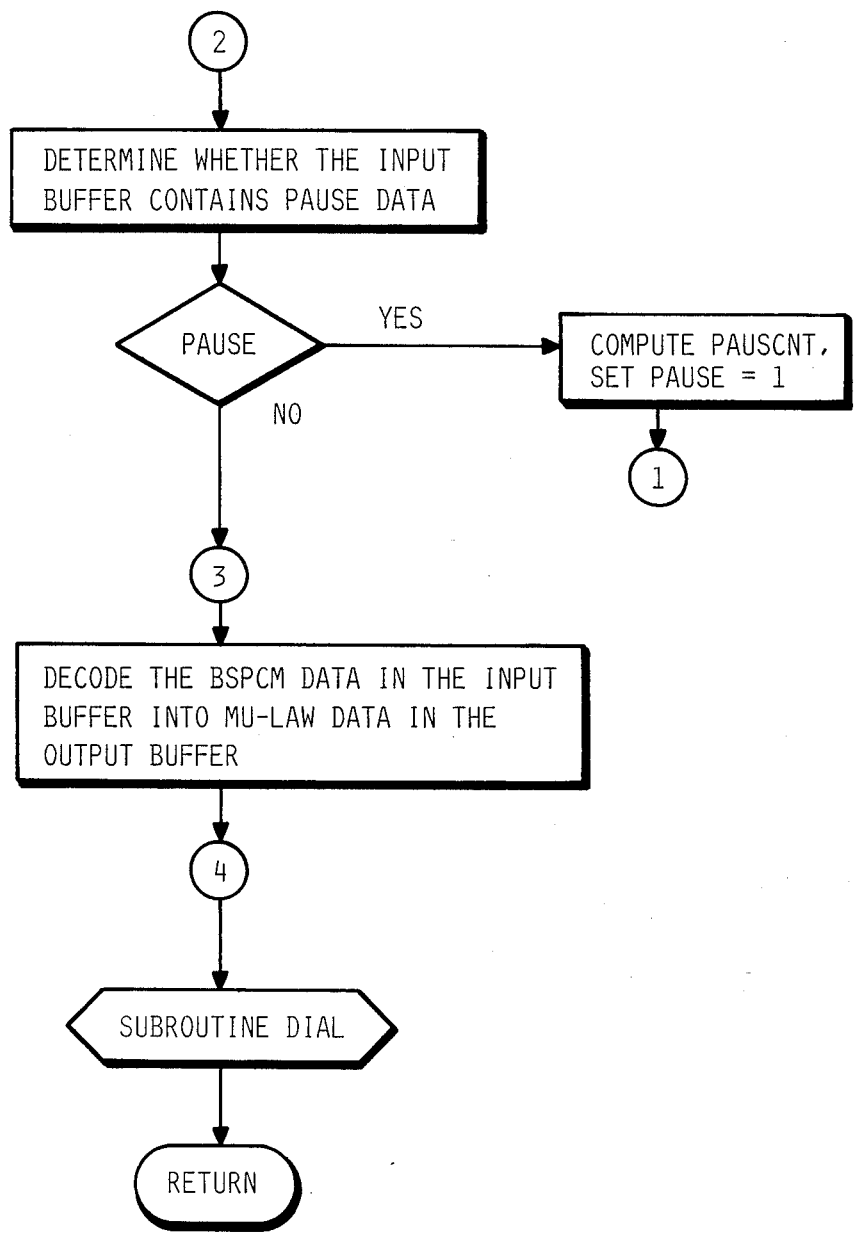
Figure 12A:
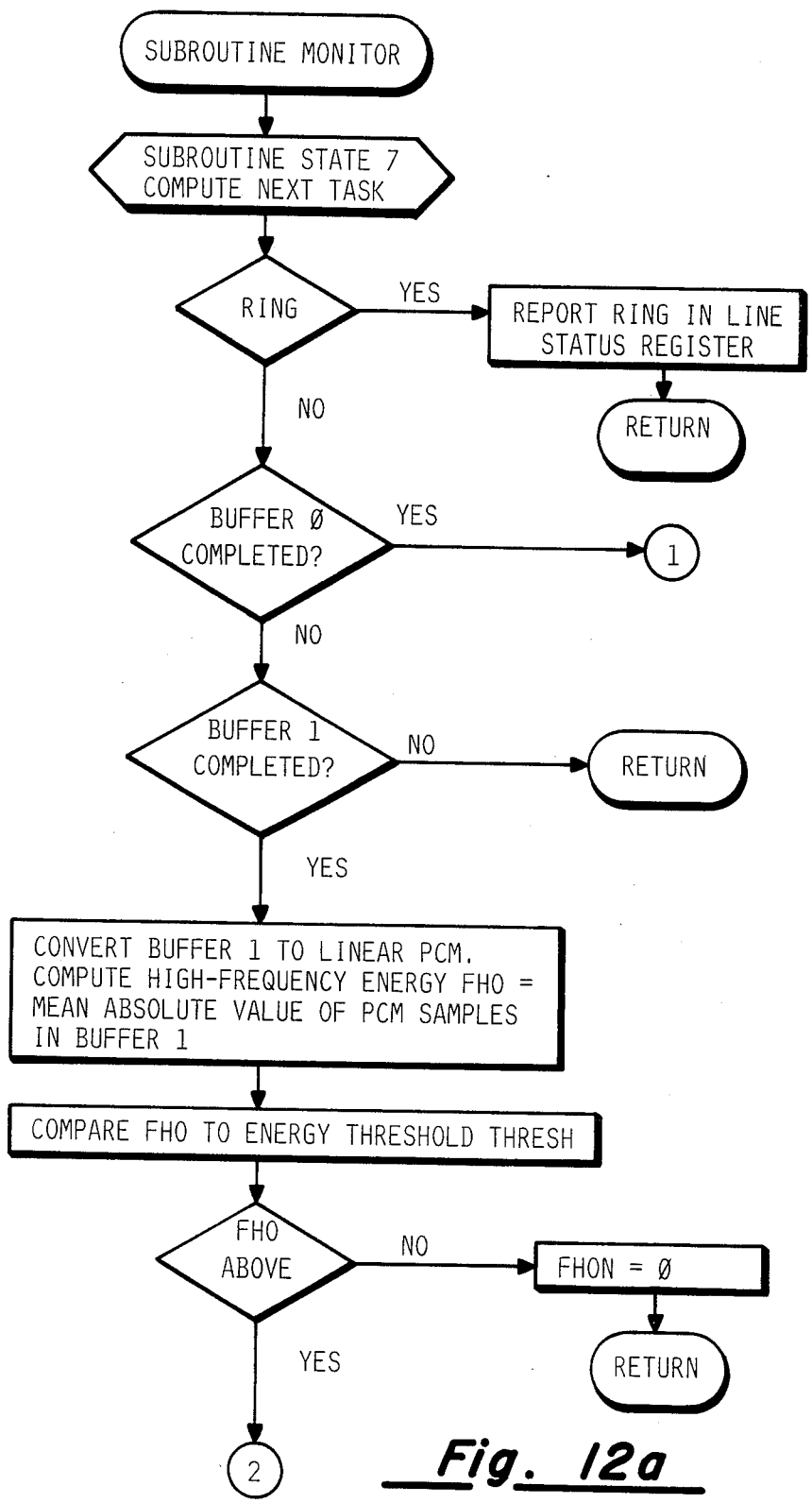
Figure 12C:
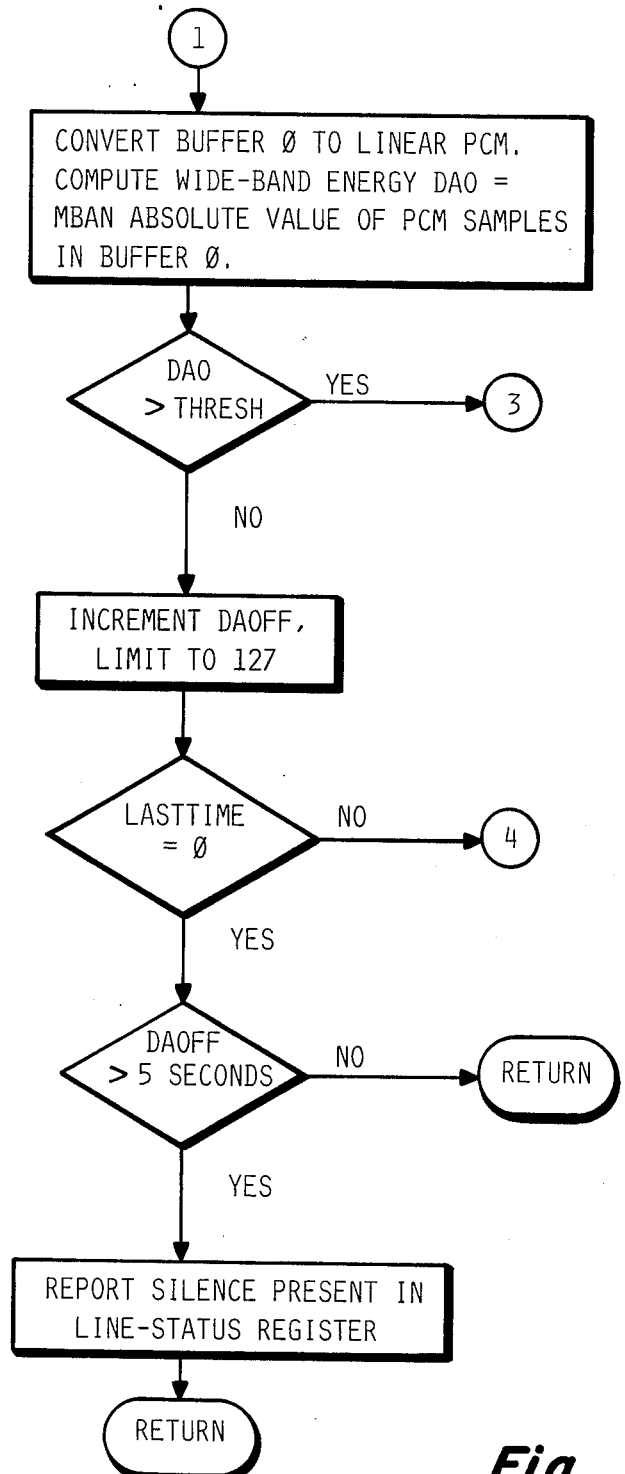
Figure 12D:
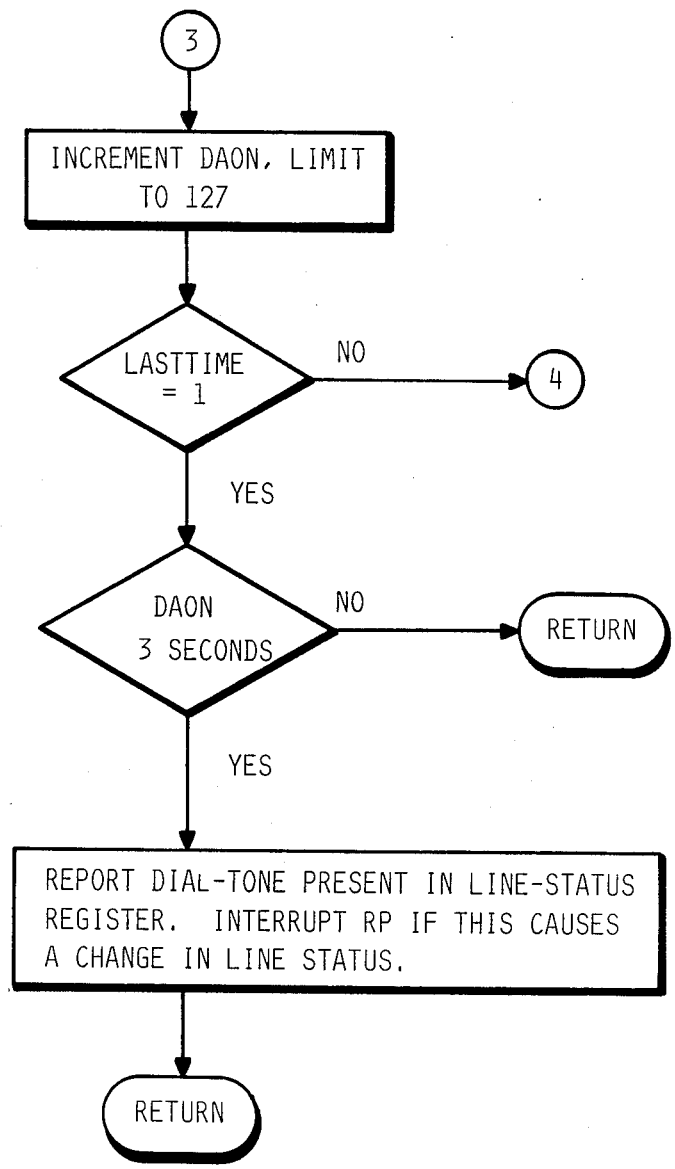
Figure 12E:
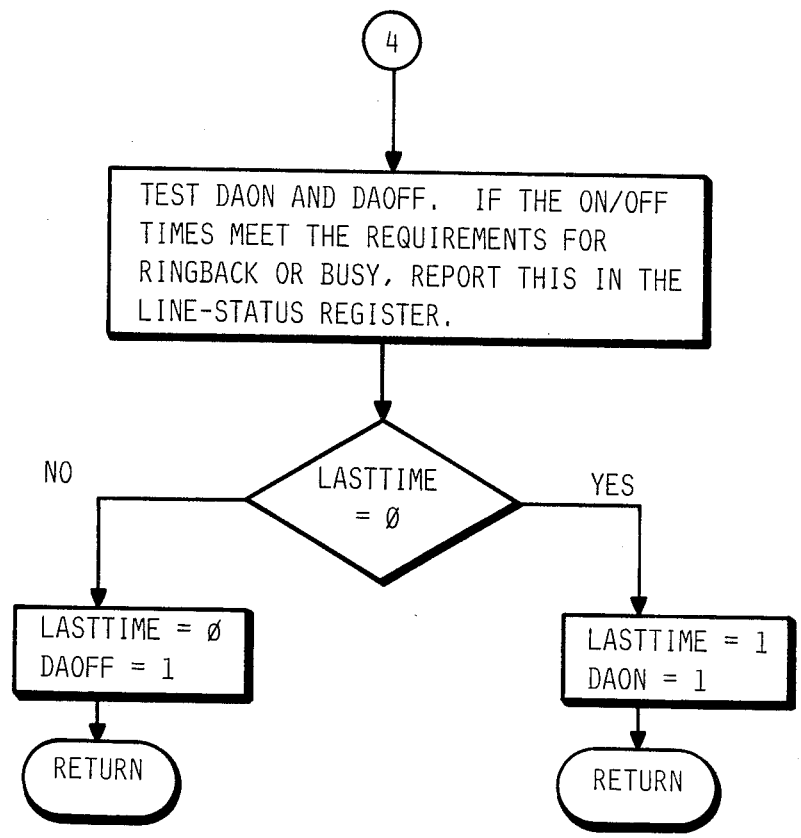
Figure 13A:
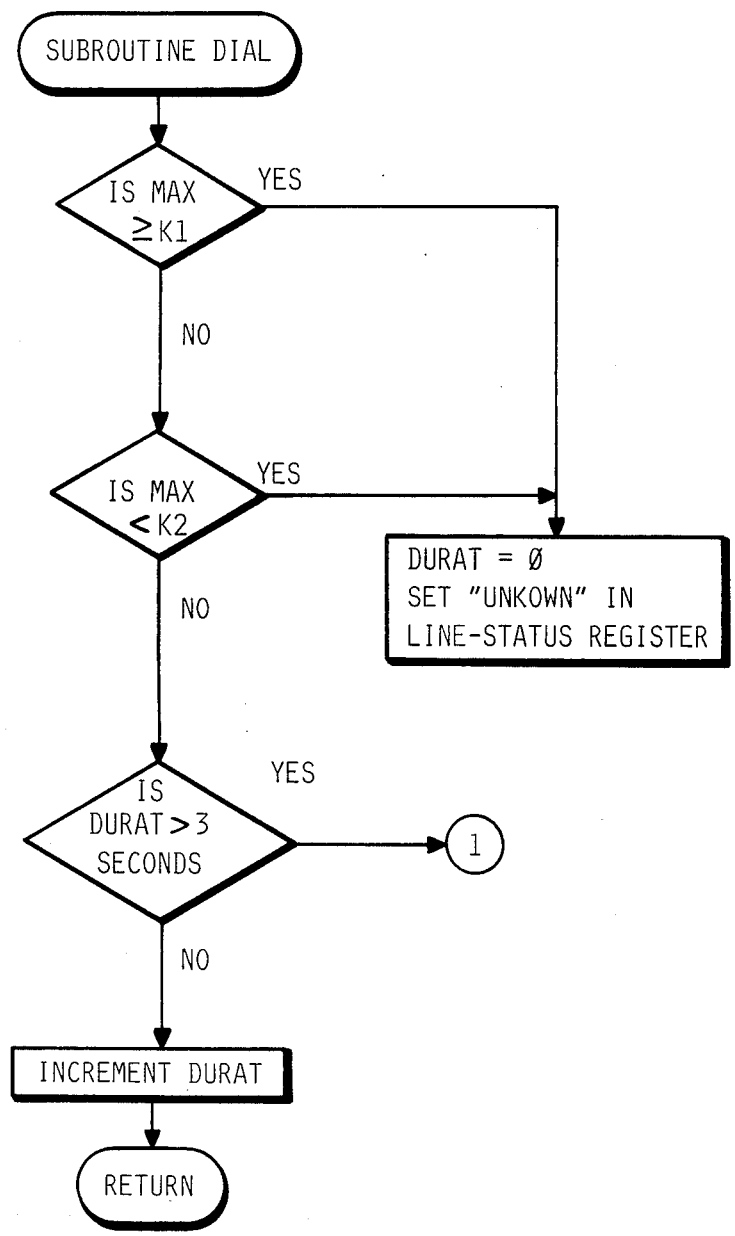
FIG. 13a and FIG. 13b, show the flow chart of the microprogram subroutine which accomplishes the dialed placement of a telephone line interconnection by the circuit of the present invention.
Figure 13B:
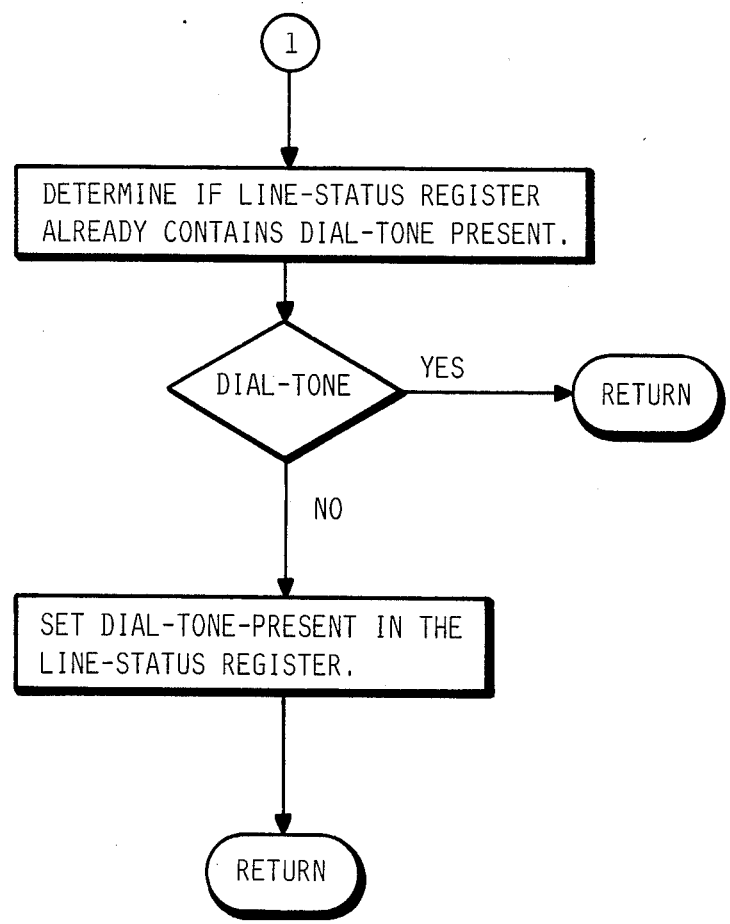

Detail flowcharts of certain microprogram subroutines are shown in FIG. 10 through FIG. 13. FIG. 10, consisting of FIG. 10a through FIG. 10c, shows a flowchart of the INPUT microprogram subroutine, which is but the microcode only portion of the generalized, hardware and microcode responsive, input process block diagrammed in FIG. 4. Similarly, the OUTPUT microprogram subroutine is flow charted in FIG. 11, consisting of FIG. 11a through FIG.11c. This subroutine is the microprogram component of the generalized, hardware and microcode responsive, input process previously block diagrammed in FIG. 8. The microprogram subroutine MONITOR flowcharted in FIG. 12, consisting of FIG. 12a through FIG. 12e, is the operatinal state from which the audio processor detects activity, either input audio signals, or DTMF control tones, or control status such as dial tone, ringback or busy. Finally, the flowchart of the microprogram subroutine DIAL is shown in FIG. 13, consisting of FIG. 13a and FIG. 13b. This microprogram subroutine DIAL, which monitors the receipt of a dial tone by the speech sampling and companding device, is referenced by the OUTPUT microprogram subroutine flowcharted in FIG. 11, and could have been included therein. It is separated only because of its length, and in illustration of the manner by which it determines the DAO energy in the manner previously discussed. The labels, mnemonics, and abbreviations utilized in all flowcharts are generally explained, and it should be possible for a routineer in the art to readily associate the microprogram activities being performed therein with the previously described, and block diagrammed, functional performance of the present speech sampling and companding circuit device.

The speech sampling and companding circuit of the present invention is a versatile analog signal processing machine. Its versatility partially stems from its inclusion within a dual processor architecture. Together the co-processors on the voice I/O module perform audio data compression, volume and speech rate control and telephone line supervision. Coupled with a controlling minicomputer, the module forms the heart of a system which automates the human environment through voice information transfer. Although presently implemented specifically for audio input and output in a record/playback mode, applications for the speech sampling and companding device of the present invention extend beyond this voice response application to voice recognition, wherein the device could provide a powerful front end processor for voice recognition applications.

What is claimed is:

1. A method for the digital encoding of an analog electrical signal representing speech comprising:
   digitalizing said analog electrical signal at a sampling rate in order to produce upon an interval of time a multiplicity, or block, of linear pulse code modulated samples;
   computing a scale factor for said multiplicity of pulse code modulated samples as a first quantity divided by a second quantity, wherein siad first quantity equals the maximum valued one of said multiplicity of samples minus the minimum valued one of said multiplicity of samples while said second quantity equals a constant number; and
   generating, as said digital encoding of said analog electrical signal, a multiplicity of successive ones of digital code words wherein each successive one digital code word is formulated as a third quantity divided by said scale factor, wherein said third quantity equals a corresponding one of said multiplicity of pulse code modulated samples minus said minimum valued one of said multiplicity of samples;
   whereby said method of digital encoding is called Block-Scaled Pulse Code Modulation because a multiplicity, or Block, of Pulse Code Modulated samples are Scaled by a factor, a scale factor, which scale factor is computed in consideration of the dynamic range of said multiplicity, or Block, of Pulse Code Modulated Samples.

2. The digital encoding method according to claim 1 wherein said digitalizing step further comprises:
   analog-to-digital converting said analog signal at said sampling rate in a (Greek letter) "mu" law companding CODer-DECoder (CODEC) in order to produce upon an interval of time a multiplicity, or block, of digital samples; plus
   digital-to-digital converting said multiplicity of digital samples into a corresponding multiplicity, or block, of linearized digital samples, wherein said linearized digital samples by being correspondent to said digital samples which by action of said "mu" law companding CODer-DECoder are proportional to said analog electrical signal are thusly linear pulse code modulated samples.

3. The digital encoding method according to claim 2 wherein said digital-to-digital converting step further comprises:
   converting through a table lookup said digital output of said (Greek letter) "mu" law companding CODer-DECoder (CODEC) ino said multiplicity of pulse code modulated samples.

4. The digital encoding method according to claim 1 wherein said digitalizing step is further defined as:
   digitalizing said analog electrical signal at a sampling rate of approximately 6 kilohertz in order to produce, during an interval of approximately 41 milliseconds, a multiplicity of approximately 246 eight-bit linear pulse code modulated samples;
   and wherein said computing step is further defined as:
   computing a scale factor for said multiplicity of pulse code modulated samples as the rounded first quantity equaling the maximum valued one of said multiplicity of samples minus the minimum valued one of said multiplicity of samples divided by a constant number second quantity equaling, or approximately equaling, 16;
   whereby if said constant number second quantity equals 16, then said rounded scale factor developed in consideration of eight-bit pulse code modulated samples is thusly four binary bits in length.

5. The digital encoding method according to claim 1 which further comprises after said generating step:
   formulating, as a block of digital data words communicatable to other digital devices, a record consisting of said multiplicity of successive ones of said digital code words, plus said computed scale factor, plus said minimum valued one of said multiplicity of linear pulse code modulated samples;

whereby said record so formulated contains all information which is necessary to reconstruct said multiplicity of linear pulse code modulated samples from said multiplicity of said Block-Scaled Pulse Code Modulated digital code words, plus from said computed scale factor, plus from said minimum valued one of said multiplicity of linear pulse code modulated samples.

6. The digital encoding method according to claim 5 wherein said formulating step further comprises:

formulating said record consisting of said multiplicity of said successive ones of said digital code words, plus said computed scale factor, plus said minimum valued one of said multiplicity of linear pulse code modulated samples save that, when all one said multiplicity of said linear pulse code modulated samples are below an energy threshold thusly indicating silence upon said analog electrical signal representing speech, then said record consists of the number of said multiplicities of linear pulse code modulated samples which are below said energy threshold, plus said computed scale factor, plus said minimum valued one of said multiplicity of linear pulse code modulated samples whereby since said record consisting, in part, of said number of said multiplicities of linear pulse code modulated samples which are below said energy threshold is not formulated save when all one said multiplicity of said linear pulse code modulated samples are below said energy threshold, then said number, for the alternative record-formulating condition of silence upon said analog electrical signal representing speech, must equal at least one;

whereby, if all said linear pulse code modulated samples are below an energy threshold then necessarily said minimum valued one of said multiplicity of said linear pulse code modulated samples is essentialy equal to zero;

whereby since said multiplicity of said linear pulse code modulated samples were produced by said digitalizing of said analog electrical signal at said sampling rate, said record type consisting, in part, of said number of said multiplicities of pulse code modulated samples which are below said energy threshold does indicate thereby said number the length of an interval of silence upon said analog electrical signal representing speech.

7. A method for decoding Block-Scaled Pulse Code Modulated (BSPCM) digitalized information consisting of a multiplicity of BSPCM digital code words, plus a minimum valued one of that like multiplicity of linear pulse code modulated (PCM) sample quantities from which said BSPCM digital code words were originally encoded, plus a range increment sale factor, in order to thereby said decoding reconstitute a multiplicity of linear PCM digital sample words, said decoding method comprising:

receiving, all as information input into a first buffer, a multiplicity of BSPCM digital code words, plus a minimum valued one of that like multiplicity of linear pulse code modulated (PCM) sample quantities from which said BSPCM digital code words were originally encoded, plus a range increment scale factor which is that quantity equaling the maximum valued one minus the minimum valued one of said multiplicity of linear PCM sample quantities from which said BSPCM digital code words were originally encoded entirely divided by a constant number;

computing from and upon the contents of said buffer a multiplicity of linear PCM digital sample words wherein each successive one is formulated as ((the corresponding successive one of said multiplicity of BSPCM digital code words) times (said range increment scale factor)) plus (said minimum valued one of said multiplicity of linear PCM sample quantities); and storing said computed multiplicity of linear PCM digital sample words in a second buffer;

whereby said receiving, said computing, and said storing, digitalized information of a BSPCM nature which, most notably, is both more compact than PCM information but which BSPCM information is not directly susceptible to digitalized signal processing has been decoded into PCM digitalized information which is, most notably, susceptible to digitalized signal processing operations.

8. The BSPCM digitalized information decoding method of claim 7 extended to incorporate digitalized signal processing, said decoding and signal processing method further comprising:

modifying each said PCM digital sample words in place within said second buffer by shiftng, specifically by either right-shifting each said digital sample words either two places or one place, or by either left-shifting each said digital sample words either one place or two places while limiting, to a maximum value threshold, the value which is by said left-shifting obtained;

whereby said modifying by right-shifting two places, by right-shifting one place, by left-shifting one place, or by left-shifting two places a change in the PCM encoded loudness, from softest to soft to loud to loudest, of said PCM digital samples words is obtained:

whereby said shifting is a method of digitalized signal processing for the control of the loudness represented by linear PCM digital encoded information.

9. The BSPCM digitalized information decoding method of claim 7 extended to incorporate digitalized signal processing, said decoding and signal processing method further comprising:

modifying a succession of PCM digital samples words within said multiplicity of PCM digital samples words within said second buffer by the respective successive repetitive addition of a plurality of digital values proportional to that amplitude, both positive and negative, which is obtained upon each of a like plurality of parts of one cycle of a sine wave;

whereby said modifying accomplishes the mixing of a digitalized sine wave signal, or tone, with said PCM digital sample words.

10. The BSPCM digitalized information decoding method of claim 7 further comprising:

converting said computed multiplicity of linear PCM digital sample words stored in said second buffer into an audio analog speech output signal.

11. The BSPCM digitalized information decoding method of claim 10 when, additionally to said multiplicity of BSPCM digital code words plus said minimum valued one of said PCM sample quantities plus said range increment scale factor, further data concerning the pause, or silence interval, duration between successive intervals of BSPCM encoded speech is also part of said information, wherein said receiving step further comprises:

receiving said data concerning said pause, or silence interval, duration between successive intervals of BSPCM encoded speech into said first buffer;

and wherein said converting step further comprises:

converting said data concerning said pause, or silence interval, duration between successive intervals of BSPCM encoded speech into a null, or silent, audio analog output signal equal in duration to the time value of said data.

12. The BSPCM digitalized information decoding method of claim 11 extended to incorporate signal processing, said decodiing and signal processing method further comprising before said converting step:

modifying said data concerning said pause, or both said data concerning said pause plus said computed multiplicity of linear PCM digital sample words, by either increasing the magnitude, or the duration, of all said data concerning said pause, or by both increasing the magnitude of all said data concerning said pause plus causing each said computed multiplicity of linear PCM digital sample words, which constitute a block as stored within said second buffer, to be twice successively rendered to said converting step;

whereby said increase in said magnitude, or time duration, of all said data concerning said pause does slow said audio analog speech output signal;

whereby said increase in said magnitude, or time duration, of all said data concerning said pause plus said twice successive rendering, and a resultant twice successive said converting, of each said computed multiplicity of linear PCM sample words does maximally slow said audio analog speech output signal;

whereby the digitalized signal processing obtained by said modifying is thusly the slowing of speech rate.

13. The BSPCM digitalized information decoding method of claim 11 extended to incorporate signal processing, said decoding and signal processing method further comprising before said converting step:

modifying said data concerning said pause, or both said data concerning said pause plus said computed multiplicity of linear PCM digital sample words by either decreasing the magnitude, or time duration, of all said data concerning said pause, or by both decreasing the magnitude of all said data concerning said pause plus causing each said computed multiplicity of linear PCM digital sample words, which constitute a block as stored within said second buffer, to be truncated, with some sample words discarded, upon being rendered to said converting step;

whereby said decrease in said magnitude, or time duration, of all said data concerning said pause does speed up said audio analog speech output signal;

whereby said decrease in said magnitude, or time duration, of all said data concerning said pause plus said truncation of each said computed multiplicity of linear PCM sample words does maximally speed up said audio analog speech output signal;

whereby the digitalized signal processing obtained by said modifying is thusly the speeding up of speech rate.

* * * * *